(12) United States Patent
Soeta et al.

(10) Patent No.: US 11,984,637 B2
(45) Date of Patent: May 14, 2024

(54) TRANSMISSION LINE AND ELECTRONIC DEVICE

(71) Applicant: Murata Manufacturing Co., Ltd., Nagaokakyo (JP)

(72) Inventors: Yushi Soeta, Nagaokakyo (JP); Hiromasa Koyama, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 434 days.

(21) Appl. No.: 17/530,504

(22) Filed: Nov. 19, 2021

(65) Prior Publication Data

US 2022/0077556 A1 Mar. 10, 2022

Related U.S. Application Data

(63) Continuation of application No. PCT/JP2020/024785, filed on Jun. 24, 2020.

(30) Foreign Application Priority Data

Jul. 5, 2019 (JP) .................................. 2019-126069

(51) Int. Cl.
*H01P 3/08* (2006.01)
*H01P 3/00* (2006.01)
*H05K 1/02* (2006.01)
*H05K 3/28* (2006.01)

(52) U.S. Cl.
CPC ............. *H01P 3/088* (2013.01); *H01P 3/003* (2013.01); *H05K 1/0242* (2013.01); *H05K 3/28* (2013.01)

(58) Field of Classification Search
CPC .. H01P 3/088; H01P 3/08; H01P 3/081; H01P 3/082; H01P 3/085; H01P 3/003; H01P 3/026; H01P 3/02; H05K 1/0242; H05K 1/0237; H05K 3/28
See application file for complete search history.

(56) References Cited

U.S. PATENT DOCUMENTS

| 2005/0201065 A1 | 9/2005 | Regnier et al. |
| 2007/0205847 A1 | 9/2007 | Kushta et al. |
| 2017/0033426 A1 | 2/2017 | Baba et al. |

(Continued)

FOREIGN PATENT DOCUMENTS

| JP | H10255925 A | 9/1998 |
| JP | 2005-064467 A | 3/2005 |

(Continued)

OTHER PUBLICATIONS

Official Communication issued in International Patent Application No. PCT/JP2020/024785, mailed on Sep. 15, 2020.

*Primary Examiner* — Stephen E. Jones
(74) *Attorney, Agent, or Firm* — Keating & Bennett, LLP

(57) ABSTRACT

A transmission line includes first, second, third, and fourth signal lines, and first, second, third, and fourth electrode pads respectively connected thereto. A first main surface of an external connection portion includes a first region in which the first electrode pad and the second electrode pad are provided, and a second region in which the third electrode pad and the fourth electrode pad are provided. Each of the first electrode pad and the second electrode pad, in a plan view, is surrounded by a ground electrode, and at least one of the third electrode pad and the fourth electrode pad, in the plan view, includes a portion that is not surrounded by the ground electrode.

20 Claims, 13 Drawing Sheets

(56) References Cited

U.S. PATENT DOCUMENTS

2017/0367181 A1   12/2017   Baba
2018/0124916 A1    5/2018   Hattori

FOREIGN PATENT DOCUMENTS

| JP | 2009-100003 A | 5/2009 |
| JP | 2016-162854 A | 9/2016 |
| JP | 2017-120932 A | 7/2017 |
| JP | 2018-082070 A | 5/2018 |
| WO | 2005/086554 A1 | 9/2005 |
| WO | 2016/088693 A1 | 6/2016 |
| WO | 2017/098921 A1 | 6/2017 |

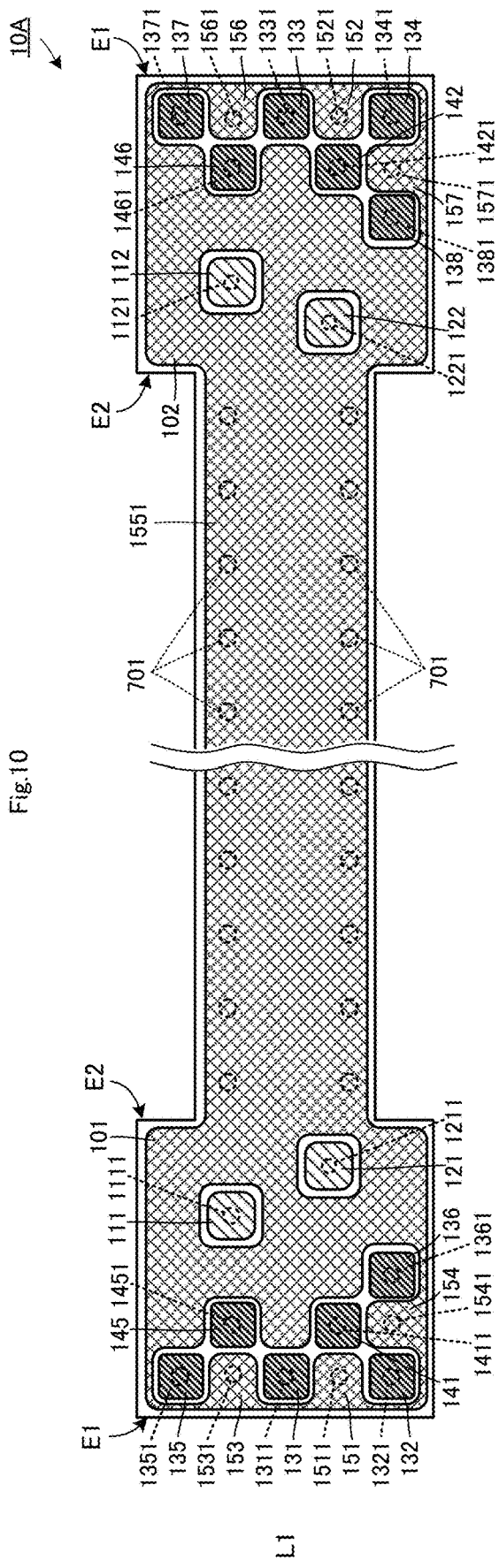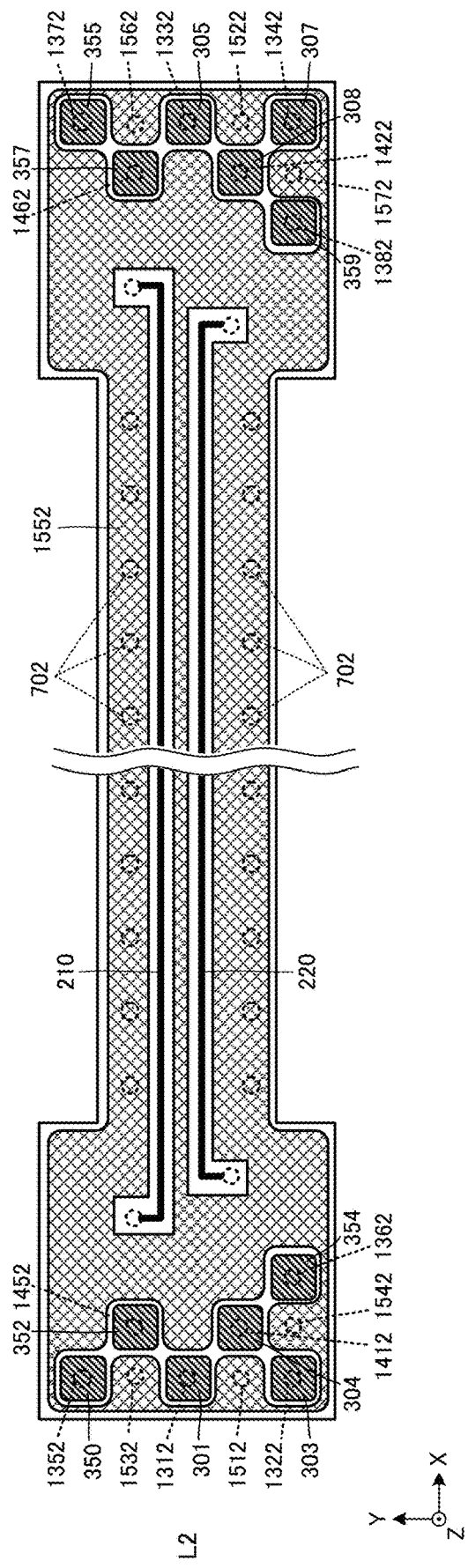
Fig.10

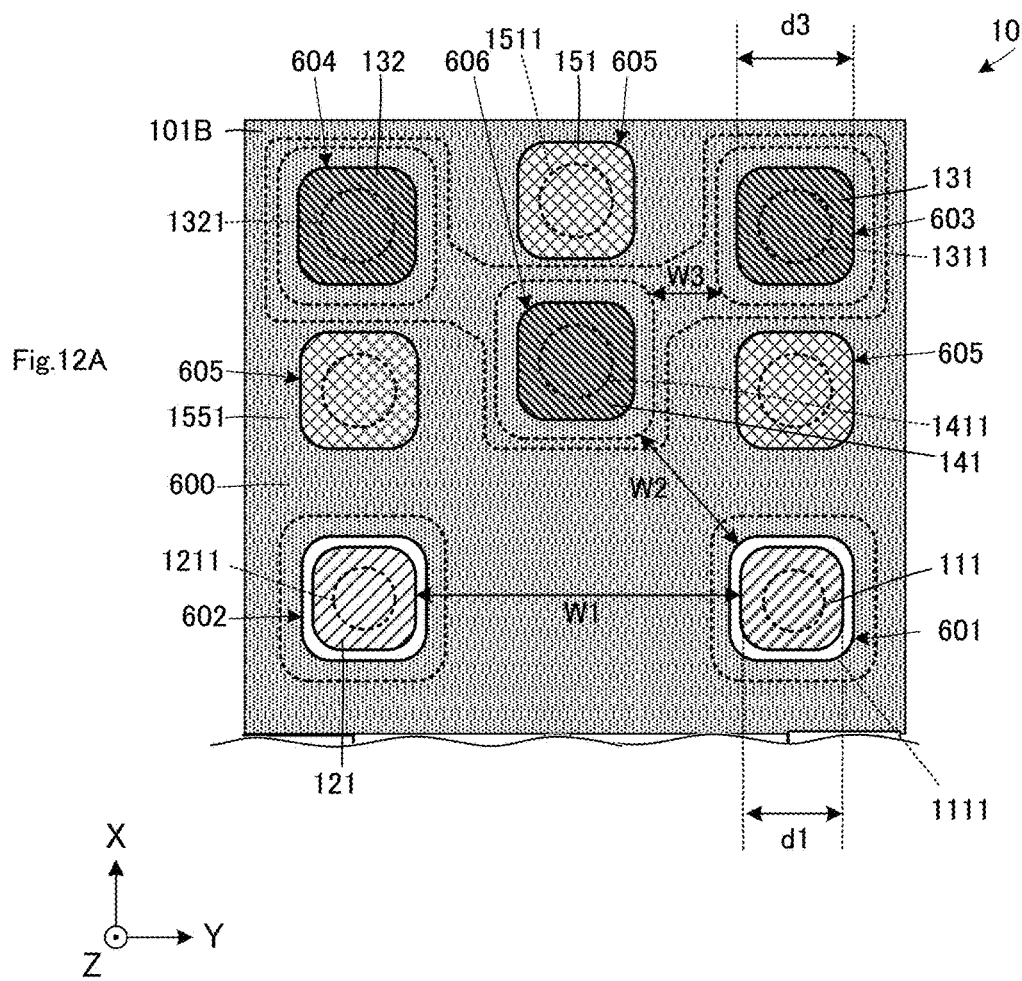
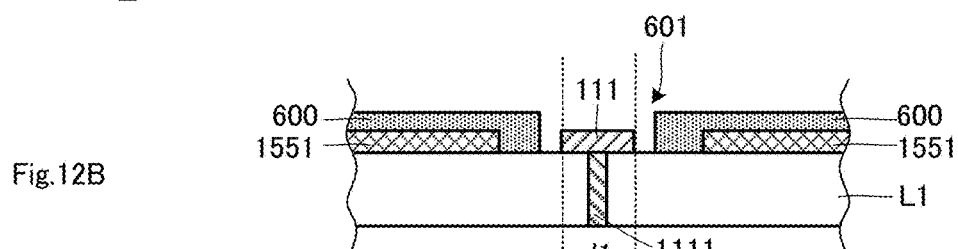
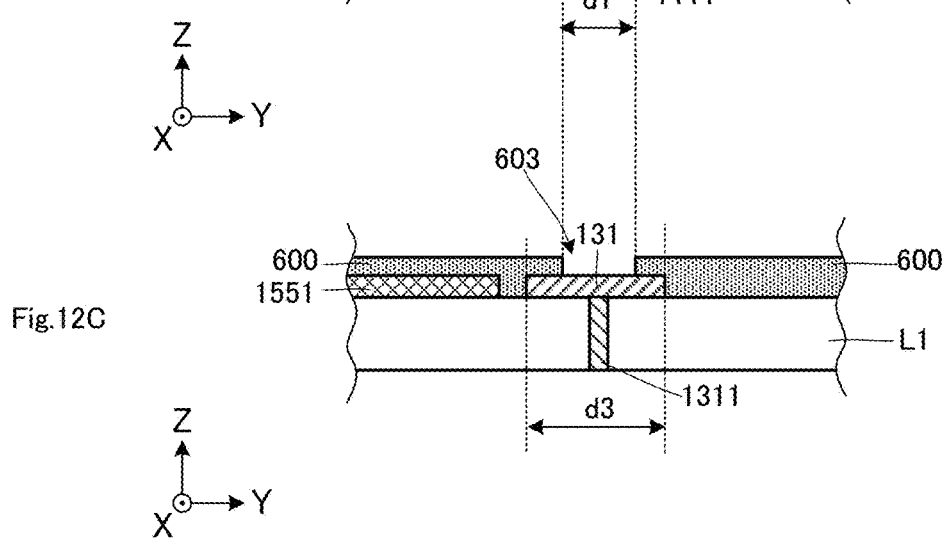
Fig.12A
Fig.12B
Fig.12C

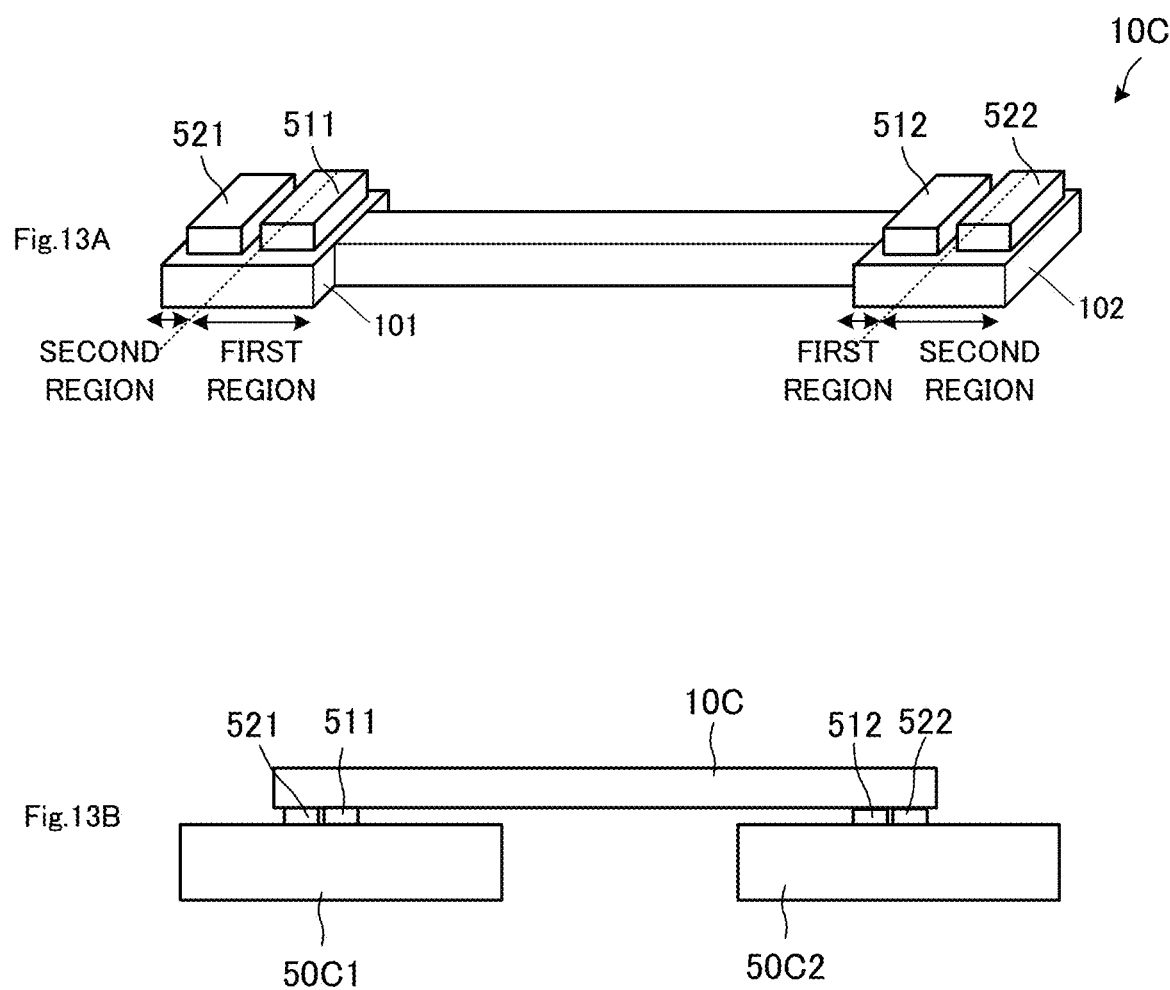

TRANSMISSION LINE AND ELECTRONIC DEVICE

CROSS REFERENCE TO RELATED APPLICATIONS

This application claims the benefit of priority to Japanese Patent Application No. 2019-126069 filed on Jul. 5, 2019 and is a Continuation Application of PCT Application No. PCT/JP2020/024785 filed on Jun. 24, 2020. The entire contents of each application are hereby incorporated herein by reference.

BACKGROUND OF THE INVENTION

1. Field of the Invention

The present invention relates to a transmission line including a plurality of signal lines, and to an electronic device including such a transmission line.

2. Description of the Related Art

International Publication No. 2017/098921 discloses a transmission line in which a plurality of signal conductors are disposed side by side in a direction of the transmission line. The transmission line includes an external connection portion including an electrode pad to be connected to an external substrate or the like. Each of the plurality of signal conductors is connected to the electrode pad of the external connection portion. In addition, the plurality of signal conductors are separated in a thickness direction, so that isolation between the plurality of signal conductors is ensured.

However, when the number of signal lines is increased in the configuration disclosed in International Publication No. 2017/098921, the density of electrode pads in the external connection portion is increased. As a result, unwanted coupling, through an electrode pad, between the signal lines and between a signal line and a ground electrode easily occurs.

On the other hand, in order to reduce the density of the electrode pads, a space between the electrode pads needs to be increased, which increases a size of the external connection portion.

SUMMARY OF THE INVENTION

Preferred embodiments of the present invention provide transmission lines that each significantly reduce or prevent unwanted coupling without increasing a size of an external connection portion.

In a transmission line according to a preferred embodiment of the present invention, at least a first signal line, a second signal line, a third signal line, and a fourth signal line are provided. A first frequency of a high-frequency signal to be transmitted through the first signal line and a second frequency of a high-frequency signal to be transmitted through the second signal line are higher than a third frequency of a high-frequency signal to be transmitted through the third signal line and a fourth frequency of a high-frequency signal to be transmitted through the fourth signal line. A first electrode pad connected to the first signal line, a second electrode pad connected to the second signal line, a third electrode pad connected to the third signal line, and a fourth electrode pad connected to the fourth signal line are provided on a first main surface of an external connection portion included in the transmission line.

The first main surface includes a first region in which the first electrode pad and the second electrode pad are provided, and a second region in which the third electrode pad and the fourth electrode pad are provided. Each of the first electrode pad and the second electrode pad is surrounded by a ground electrode in a plan view, and at least one of the third electrode pad and the fourth electrode pad includes a portion that is not surrounded by the ground electrode in the plan view.

With such a configuration, unwanted coupling, through an electrode pad for external connection, between signal lines and between a signal line and a ground electrode is significantly reduced or prevented while an external connection portion is reduced in size.

According to preferred embodiments of the present invention, transmission lines that each significantly reduce or prevent unwanted coupling without increasing a size of an external connection portion are able to be provided.

The above and other elements, features, steps, characteristics and advantages of the present invention will become more apparent from the following detailed description of the preferred embodiments with reference to the attached drawings.

BRIEF DESCRIPTION OF DRAWINGS

FIG. 10 is an exploded plan view of a first layer L1 and a second layer L2 in the transmission line 10A according to the second preferred embodiment of the present invention.

FIG. 12A is a plan view showing an external connection portion 101B of a transmission line 10B according to a third preferred embodiment of the present invention, FIG. 12B is a cross-sectional view of a first electrode pad 111, and FIG. 12C is a cross-sectional view of a third electrode pad 131.

FIG. 13A is an external perspective view of a transmission line 10C according to a fourth preferred embodiment of the present invention, and FIG. 13B is a side cross-sectional view in which the transmission line 10C is connected to a circuit board 50C1 and a circuit board 50C2.

DETAILED DESCRIPTION OF THE PREFERRED EMBODIMENTS

First Preferred Embodiment

Figure 1:
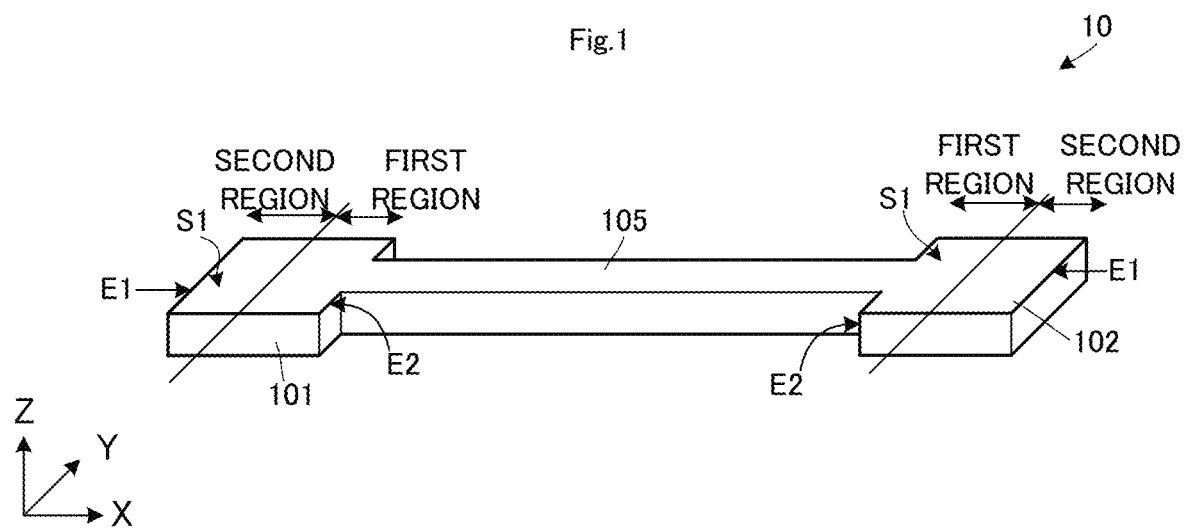
FIG. 1 is an external perspective view of a transmission line 10 according to a first preferred embodiment of the present invention.
Figure 2:
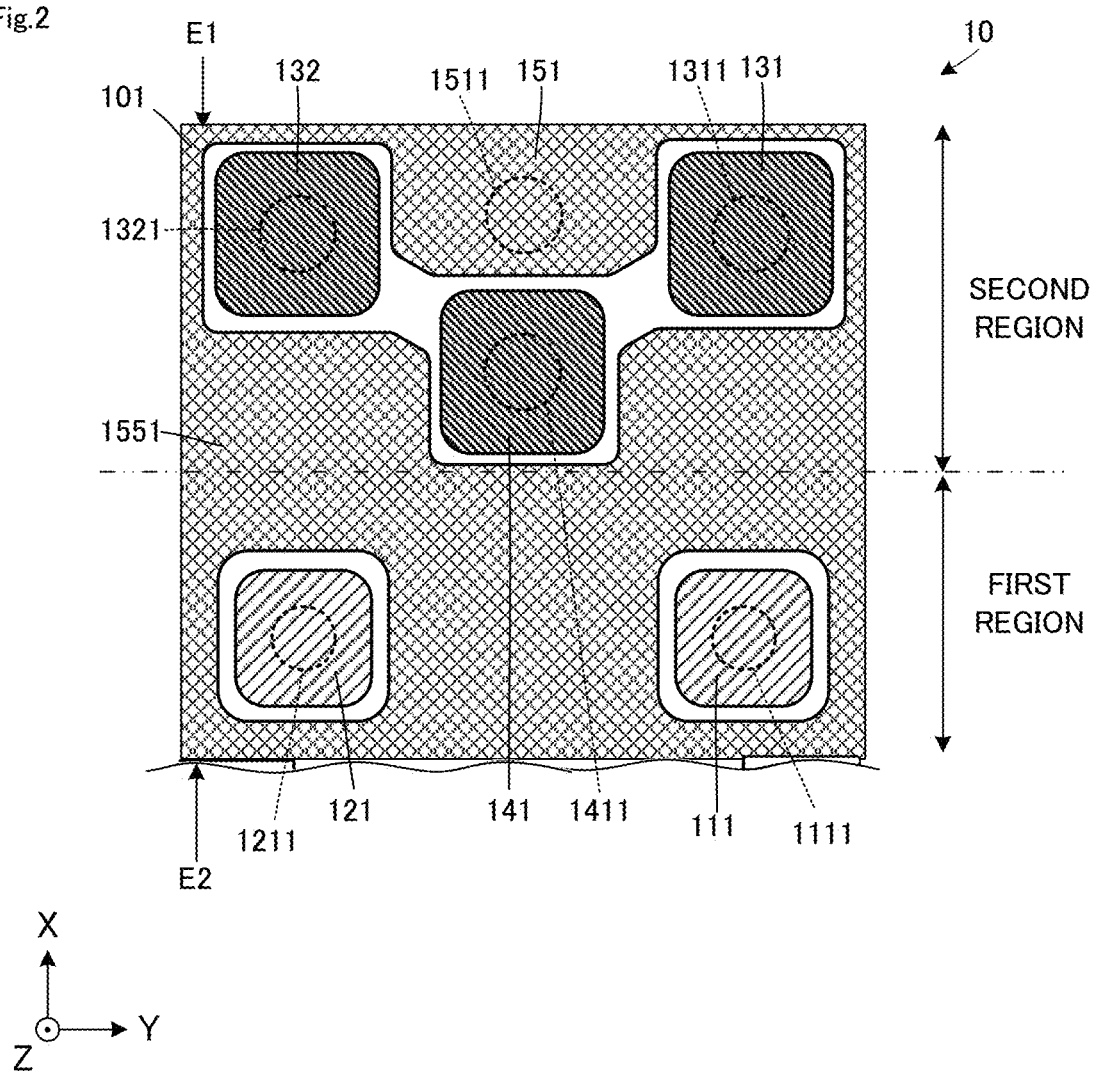
FIG. 2 is a plan view showing an external connection portion 101 of the transmission line 10 according to the first preferred embodiment of the present invention.
Figure 3:
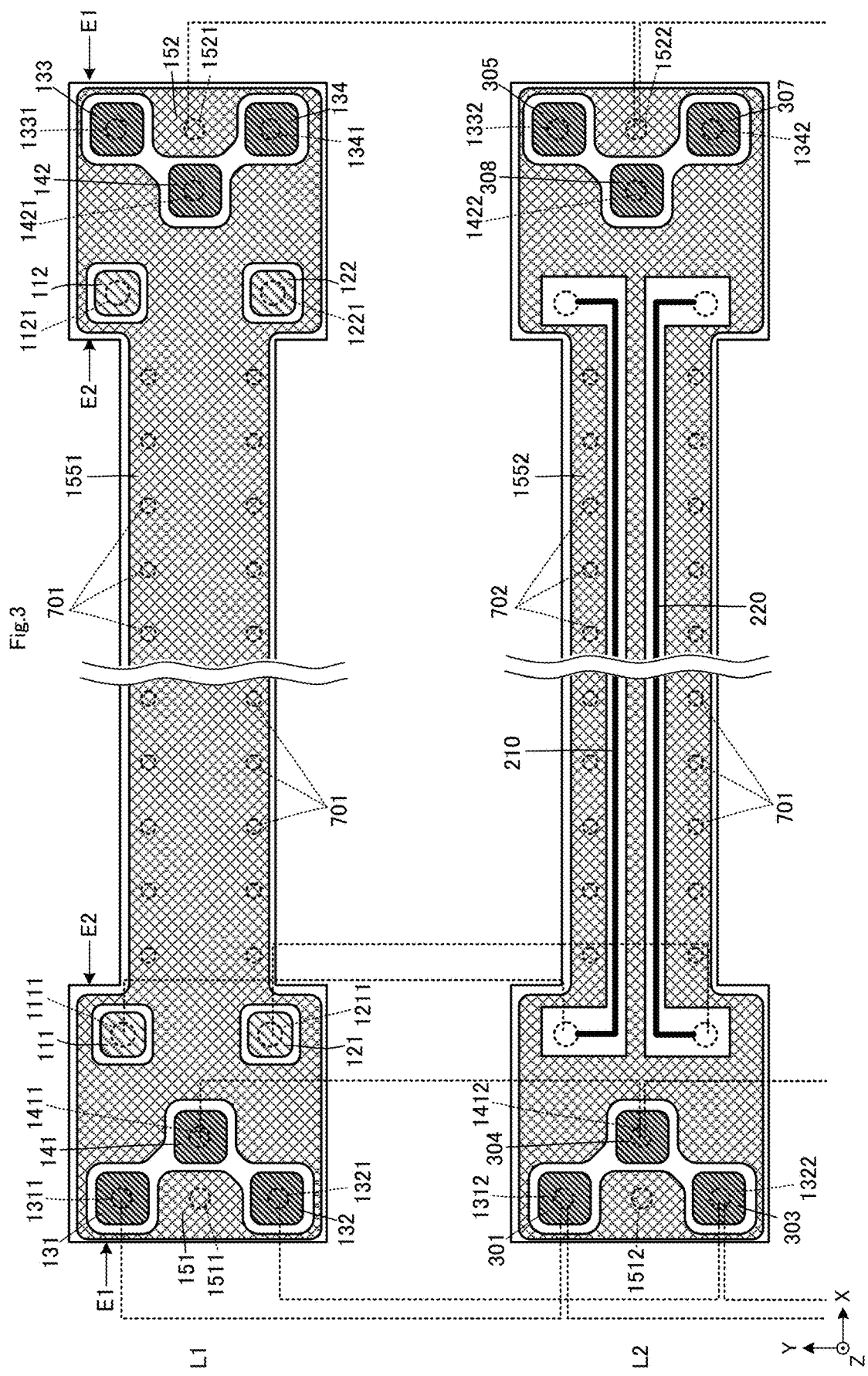
FIG. 3 is an exploded plan view of a first layer L1 and a second layer L2 in the transmission line 10 according to the first preferred embodiment of the present invention.
Figure 4:
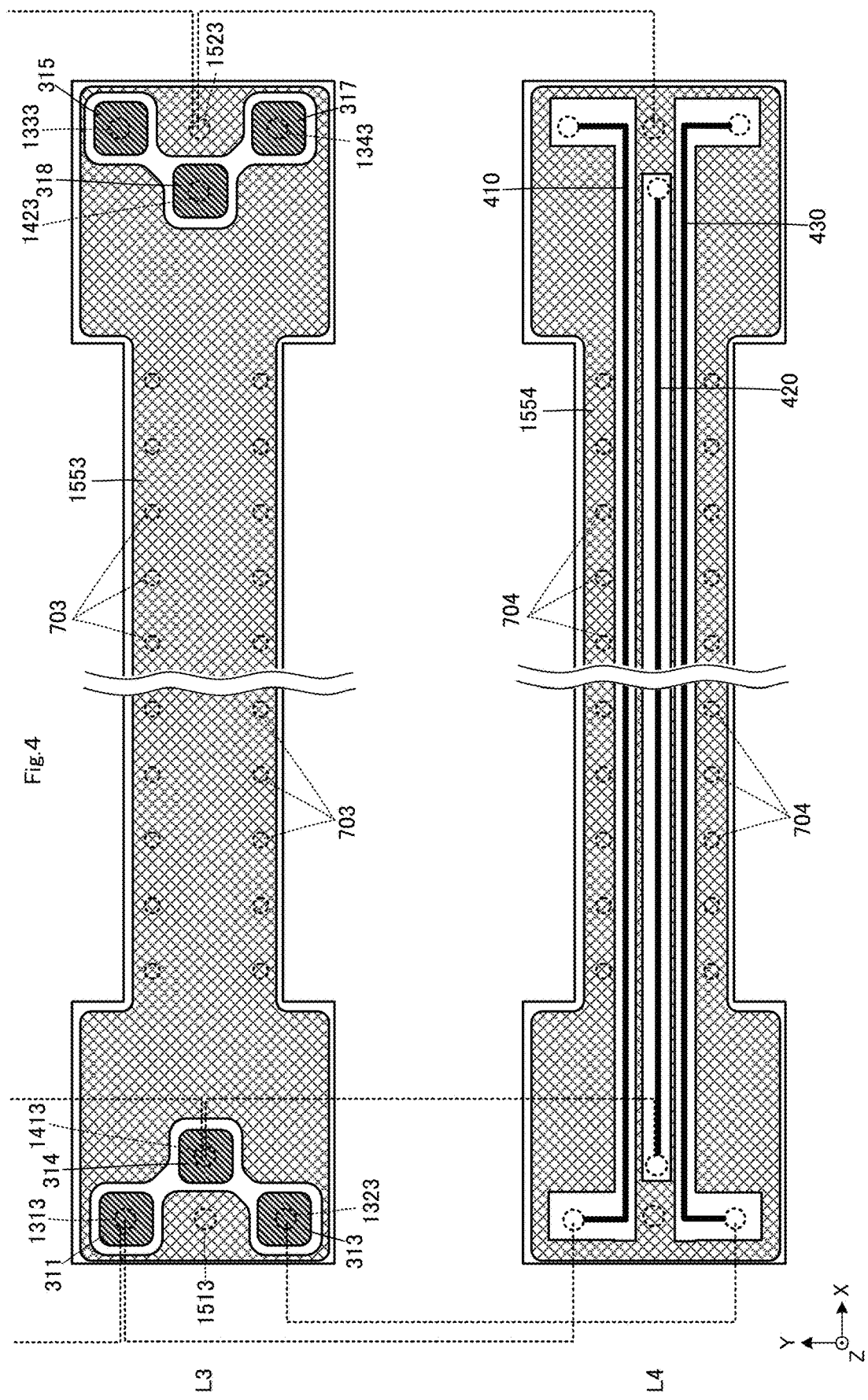
FIG. 4 is an exploded plan view of a third layer L3 and a fourth layer L4 in the transmission line 10 according to the first preferred embodiment of the present invention.
Figure 5:
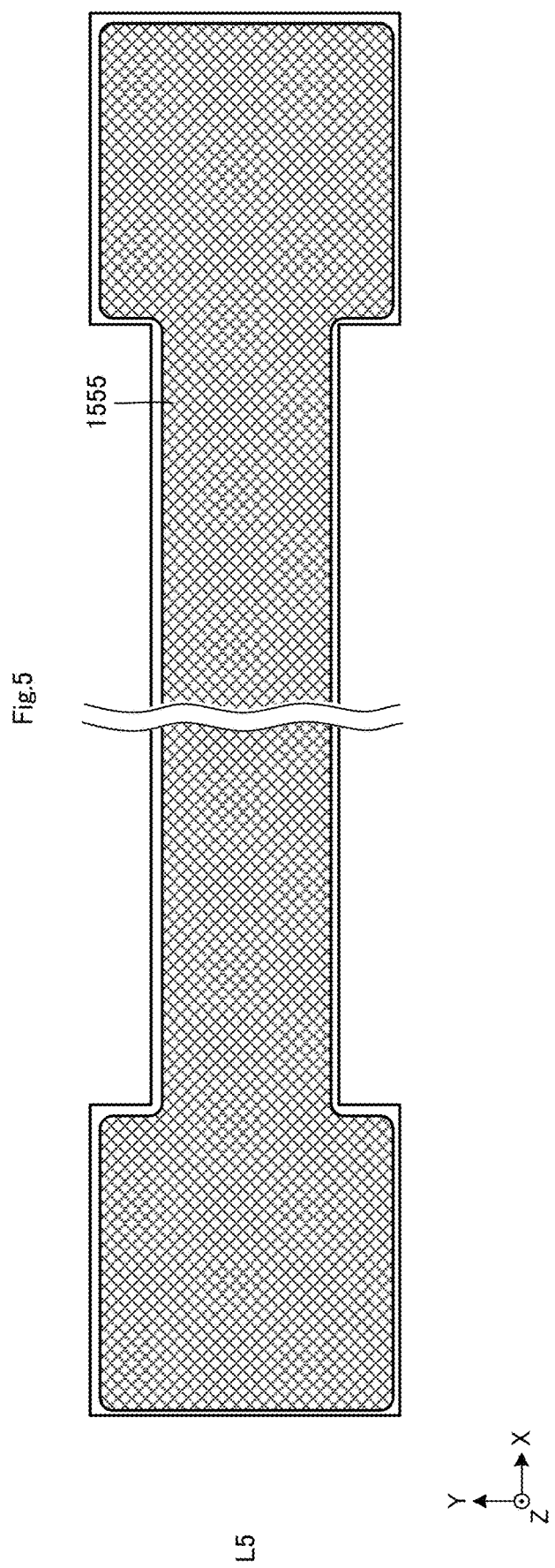
FIG. 5 is an exploded plan view of a fifth layer L5 in the transmission line 10 according to the first preferred embodiment of the present invention.
Figure 6:
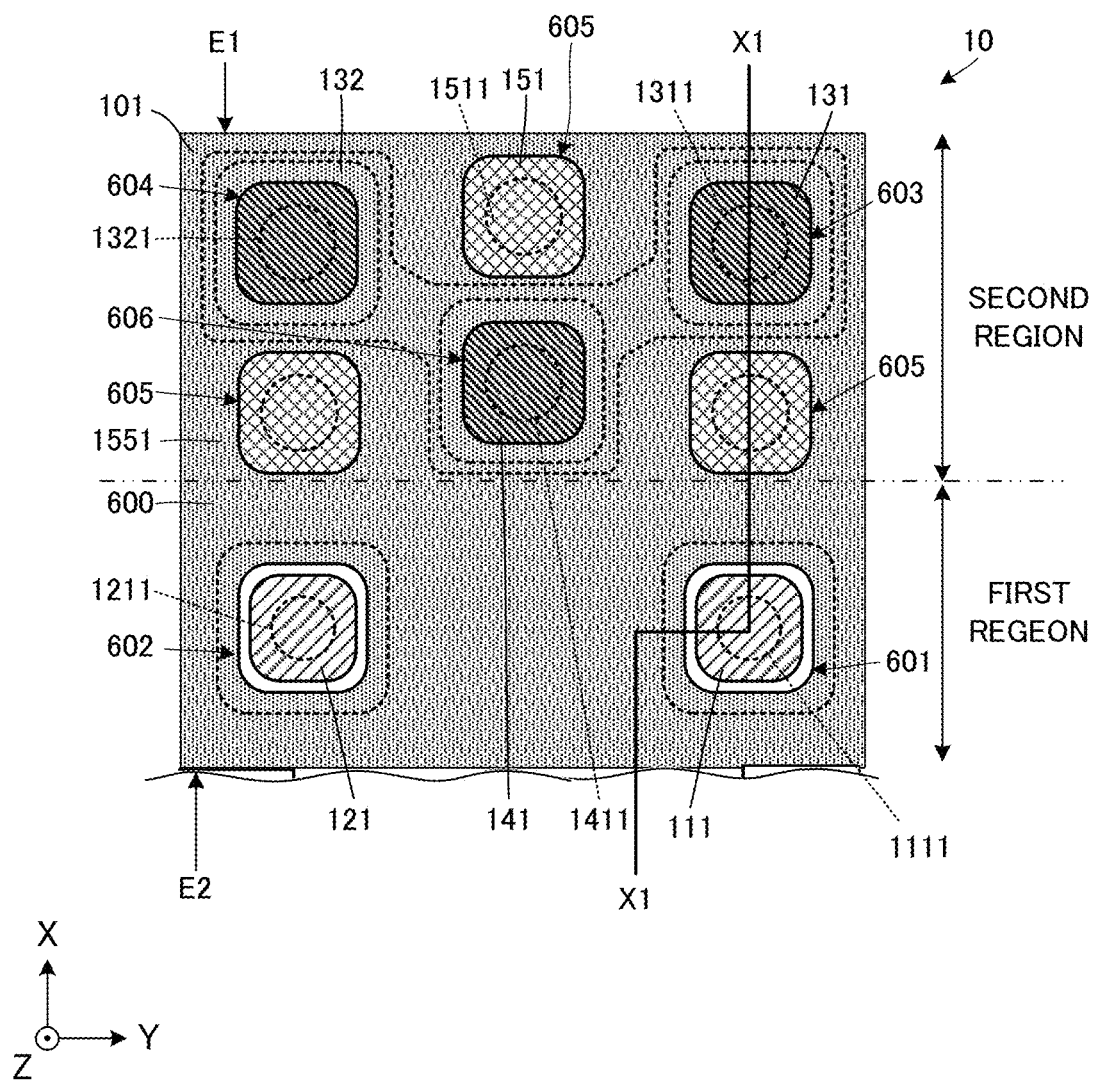
FIG. 6 is an overview of a protective layer 600 formed on the external connection portion 101 according to the first preferred embodiment of the present invention.
Figure 7:
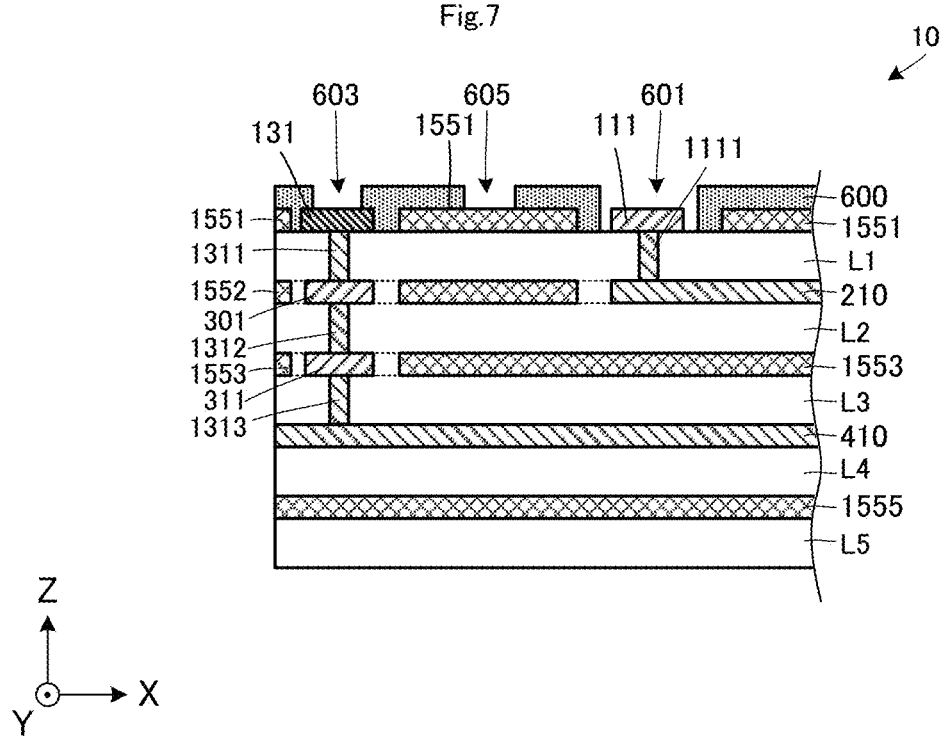
FIG. 7 is a cross-sectional view of the external connection portion 101 of the transmission line 10 according to the first preferred embodiment of the present invention.
Figure 8:
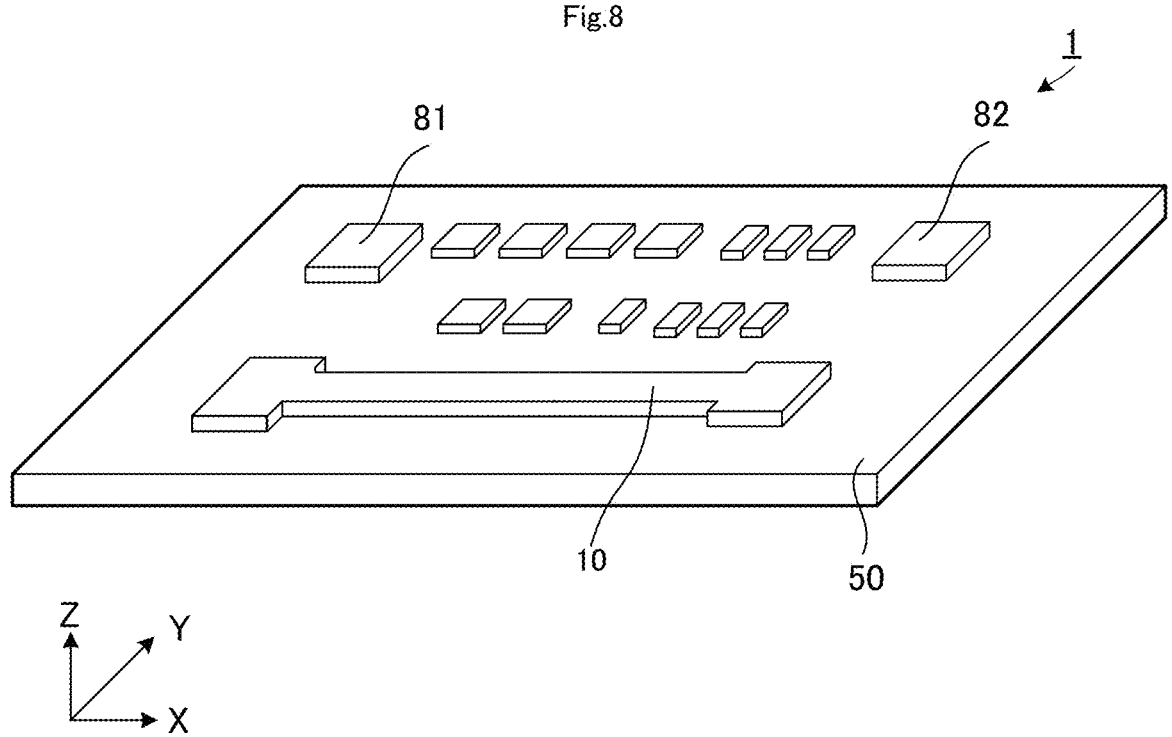
FIG. 8 is an external view of an electronic device 1 in which the transmission line 10 is mounted on a circuit board 50.

FIG. 1 is an external perspective view of a transmission line 10 according to a first preferred embodiment of the present invention. FIG. 2 is a plan view showing an external connection portion 101 of the transmission line 10 according to the first preferred embodiment. FIG. 3 is an exploded plan view of a first layer L1 and a second layer L2 in the transmission line 10 according to the first preferred embodiment. FIG. 4 is an exploded plan view of a third layer L3 and a fourth layer L4 in the transmission line 10 according to the first preferred embodiment. FIG. 5 is an exploded plan view of a fifth layer L5 in the transmission line 10 according to the first preferred embodiment. FIG. 6 is a cross-sectional view of the external connection portion 101 of the transmission line 10. FIG. 7 is a plan view showing an overview of a protective layer 600 provided on the external connection portion 101 according to the first preferred embodiment. FIG. 8 is an external view of an electronic device 1 in which the transmission line 10 is mounted on a circuit board 50. In each of the drawings in the following preferred embodiments, the vertical and horizontal dimensional relationship is emphasized as appropriate, and does not always match the actual vertical and horizontal dimensional relationship. In addition, in order to make the drawings easy to see, some reference signs are omitted.

A configuration of the transmission line 10 will be described with reference to FIG. 1. The transmission line 10 includes an external connection portion 101, a line portion 105, and an external connection portion 102. The external connection portion 101, the external connection portion 102, and the line portion 105 are integrally provided. One end of the line portion 105 is connected to the external connection portion 101, and the other end of the line portion 105 is connected to the external connection portion 102. The external connection portions 101 and 102 each have a flat plate shape. The line portion 105 has a flat plate shape, and extends in an X-axis direction (a direction of the transmission line). It is to be noted that the X-axis direction corresponds to a "first direction" and a "third direction", and a Y-axis direction corresponds to a "second direction" and a "fourth direction".

The external connection portions 101 and 102 include a first end E1 and a second end E2, respectively, at ends in the X-axis direction in an XY plane. The first end E1 is an end of the transmission line 10, and is an end on a side on which the external connection portions 101 and 102 and the line portion 105 are not connected to each other. The second end E2 is an end on a side on which the external connection portions 101 and 102 and the line portion 105 are connected to each other.

The external connection portions 101 and 102 each include a main surface S1 on which a first region and a second region are provided. The first region is provided on a side near the second end E2 of the external connection portions 101 and 102. The second region is provided on a side near the first end E1 of the external connection portions 101 and 102, in other words, at the end of the transmission line 10.

A plurality of electrode pads are provided in each of the first region and the second region. Each of the electrode pad is used as an input-output electrode for connection to an external device. The details will be described below.

The transmission line 10 is preferably made of a polyimide resin or LCP, for example. In addition, the transmission line 10 may be made of a fluororesin, for example. More specifically, the fluororesin includes polytetrafluoroethylene (PTFE), perfluoroalkoxy alkane (PFA), ethylene-tetrafluoroethylene copolymer (ETFE), and perfluoroethylene-propene copolymer (FEP), for example. Such a configuration improves chemical resistance, heat resistance, and electrical characteristics.

The detailed configuration of the transmission line 10 will be described with reference to FIG. 2, FIG. 3, FIG. 4, and FIG. 5. As described above, the external connection portions 101 and 102 include the first region and the second region. Although in FIG. 2, the external connection portion 101 will be described as an example, the external connection portion 102 has the same or substantially the same configuration.

A first electrode pad 111, a second electrode pad 121, and a ground electrode 1551 are formed in the first region of the external connection portion 101. Third electrode pads 131 and 132, a fourth electrode pad 141, a ground electrode 151, and a ground electrode 1551 are formed in the second region. It is to be noted that the ground electrode 1551 is formed in the first region and the second region. The ground electrode 1551 has a shape to connect in the first region and the second region.

Furthermore, the ground electrode 1551 is provided over the external connection portion 101, the line portion 105, and the external connection portion 102. In addition, the ground electrode 151 and the ground electrode 1551 are connected by an electrode provided along an outer periphery.

The ground electrode 1551 may have a shape divided at an intermediate position of the ground electrode 1551. The ground electrode 1551, in a case of being divided, may preferably have a shape connecting inside the transmission line 10, for example. In such a case, formation to fit a complex shape and arrangement of the electrode is able to increase the degree of freedom in design.

Connection Configuration of Electrode Pad

The first electrode pad 111 and the second electrode pad 121 are connected to a signal line that transmits a high-frequency (millimeter wave) signal for 5GNR being a first frequency and a second frequency. A first signal line that transmits a high-frequency signal in the first frequency is connected to the first electrode pad 111. A second signal line that transmits a high-frequency signal in the second frequency is connected to the second electrode pad 121. The first frequency and the second frequency may be the same frequency or may be different frequencies.

On the other hand, the third electrode pads 131, 132, 133, and 134 and the fourth electrode pads 141 and 142 are connected to a signal line that transmits a signal for 3G and LTE being a third frequency and a fourth frequency, or a control signal line or a power source line, for example. The third electrode pads 131, 132, 133, and 134 are connected to a third signal line that transmits a high-frequency signal in the third frequency. The fourth electrode pads 141 and 142 are connected to a fourth signal line that transmits a high-frequency signal in the fourth frequency. It is to be noted that the third frequency and the fourth frequency may be the same frequency or may be different frequencies.

As described above, the first frequency and the second frequency of a high-frequency signal to be transmitted through the signal line connected to the first electrode pad 111 and the second electrode pad 121 are higher than the third frequency and the fourth frequency of a high-frequency signal to be transmitted through the signal line connected to the third electrode pads 131 and 132 and the fourth electrode pad 141.

The first electrode pad 111, the second electrode pad 121, the third electrode pads 131 and 132, and the fourth electrode pad 141 are rectangular or substantially rectangular planar conductors and may be copper foil, for example. The corner portions of the electrode pads preferably have an R chamfered shape, for example. As a result, such a shape is able to significantly reduce or prevent coupling between the electrodes, compared with a non-R chamfered shape (a shape including a corner).

Structure of External Connection Portion 101

First, a structure of the external connection portion 101 will be described with reference to FIG. 2, FIG. 3, FIG. 4, and FIG. 5. In the first region, the first electrode pad 111 and the second electrode pad 121 are disposed with a predetermined distance therebetween. More specifically, the first electrode pad 111 and the second electrode pad 121 are provided in the Y-axis direction.

Each of the outer periphery of the first electrode pad 111 and the outer periphery of the second electrode pad 121, in a plan view, is surrounded by the ground electrode 1551 with a predetermined distance therebetween. In particular, in the present preferred embodiment, each of the first electrode pad 111 and the second electrode pad 121, in the plan view, is surrounded by the ground electrode 1551 continuously provided on main surface of the external connection portion 101.

Each of the first electrode pad 111 and the second electrode pad 121 is surrounded over the entire or substantially the entire periphery by the ground electrode 1551, so that sufficient isolation of a transmission line that transmits a signal of the first frequency and the second frequency is able to be ensured. In addition, the ground electrode 1551 has a continuous shape, which significantly reduces or prevents noise from leaking from the first electrode pad 111 and the second electrode pad 121. Moreover, detachment of the ground electrode 1551 is also significantly reduced or prevented. It is to be noted that the ground electrode 1551, by being continuous, has a shape to connect in the first region and the second region. In addition, when the first electrode pad 111 and the second electrode pad 121 are separated from each other, an interlayer connection conductor connected to the first electrode pad 111 and an interlayer connection conductor connected to the second electrode pad 121 are separated from each other. As a result, coupling between the interlayer connection conductors is significantly reduced or prevented.

In the Y-axis direction in the second region in the external connection portion 101, components are provided in order of the third electrode pad 131, the ground electrode 151, and the third electrode pad 132. In the Y-axis direction of the external connection portion 101, the fourth electrode pad 141 locates between the ground electrode 1551.

In such a case, the third electrode pads 131 and 132 and the fourth electrode pad 141 are provided at different positions in the X-axis direction. In other words, a distance between the third electrode pad 131 and the fourth electrode pad 141 is increased, in comparison with a case (a case in which the third electrode pads 131 and 132 and the fourth electrode pad 141 are arranged side by side on a straight line in the Y-axis direction) in which the third electrode pads 131 and 132 and the fourth electrode pad 141 are provided at the same position in the X-axis direction. Therefore, the distance between the electrode pads is able to be ensured, and unwanted coupling is significantly reduced or prevented.

The third electrode pad 131 is adjacent to the ground electrode 151 and a portion of the ground electrode 1551. The third electrode pad 132 is adjacent to the ground electrode 151 and a portion of the ground electrode 1551.

The fourth electrode pad 141 is surrounded by the ground electrode 151 and the portion of the ground electrode 1551.

Each of a portion of the outer periphery of the third electrode pads 131 and 132 and a portion of the outer periphery of the fourth electrode pad 141, in the plan view, is surrounded by the ground electrode 151 or the ground electrode 1551. In other words, the outer periphery of the third electrode pads 131 and 132 and the fourth electrode pad 141 includes a portion that is not surrounded by the ground electrode 151 and the ground electrode 1551. Each of a portion of the third electrode pads 131 and 132 and a portion of the fourth electrode pad 141, in the plan view, is surrounded by the ground electrode 1551 continuously provided on the main surface of the external connection portion 101.

More specifically, the ground electrode 151 or the ground electrode 1551 is not provided in at least a portion of a region between the third electrode pad 131 and the fourth electrode pad 141. In addition, the ground electrode 151 or the ground electrode 1551 is not provided in at least a portion of a region between the third electrode pad 132 and the fourth electrode pad 141.

Structures in the first region and the second region of the external connection portion 101 will be compared. Leakage of an electric field of a signal of the third frequency and the fourth frequency is smaller than leakage of an electric field of the signal of the first frequency and the second frequency. In such a case, the signal of the third frequency and the fourth frequency is more difficult to spread than the signal of the first frequency and the second frequency. Then, even when the third electrode pads 131 and 132 and the fourth electrode pad 141 are disposed close to each other, coupling between the electrode pads is difficult to occur in a case of the signal of the third frequency and the fourth frequency.

However, the third electrode pads 131 and 132 and the fourth electrode pad 141 are close to each other, and, further, the ground electrode is disposed between the third electrode pads 131 and 132 and the fourth electrode pad 141, a distance between the ground electrode and the electrode pads is reduced, and so as not to be partially disposed between the third electrode pads 131 and 132 and the fourth electrode pad 141 in order to significantly reduce or prevent the capacitive coupling from increasing. In other words, even when the distance between the third electrode pads 131 and 132 and the fourth electrode pad 141 in the second region is short, the ground electrode is not disposed between the third electrode pads 131 and 132 and the fourth electrode pad 141, so that deterioration of characteristics is able to be significantly reduced or prevented. Furthermore, even when an area of the second region is small, a large number of electrode pads (the third electrode pads 131 and 132, and the fourth electrode pad 141) are able to be disposed.

With such a configuration, an area of the ground electrodes 151 and 1551 in the second region is able to be reduced, and the second region of the external connection portion 101 is able to be reduced in size.

In addition, even when a distance between the third electrode pads 131 and 132 and the fourth electrode pad 141 is reduced, the deterioration of characteristics is small. As a result, the distance between the third electrode pad 131 and the fourth electrode pad 141 is reduced, so that a large number of the third electrode pads 131 and 132 and the fourth electrode pads 141 are able to be disposed in the second region.

Structure of External Connection Portion 102

Next, a structure of the external connection portion 102 will be described with reference to FIG. 3 and FIG. 4. A first electrode pad 112 and a second electrode pad 122 are disposed with a predetermined distance therebetween, in the first region. More specifically, the first electrode pad 112 and the second electrode pad 122 are provided in the Y-axis direction.

Each of the outer periphery of the first electrode pad 112 and the outer periphery of the second electrode pad 122, in the plan view, is surrounded by the ground electrode 1551 with a predetermined distance therebetween.

Each of the first electrode pad 112 and the second electrode pad 122 is surrounded over the entire or substantially the entire periphery by the ground electrode 1551, so that sufficient isolation of a transmission line that transmits a signal of the first frequency and the second frequency is able to be ensured.

In the Y-axis direction in the second region in the external connection portion 102, components are provided in order of the third electrode pad 133, the ground electrode 152, and the third electrode pad 134. In the Y-axis direction of the external connection portion 101, the fourth electrode pad 142 locates between the ground electrode 1551.

In such a case, the third electrode pads 133 and 134 and the fourth electrode pad 142 are provided at different positions in the X-axis direction. In other words, a distance between the third electrode pads 133 and 134 and the fourth electrode pad 142 is increased, in comparison with a case (a case in which the third electrode pads 133 and 134 and the fourth electrode pad 142 are arranged side by side on a straight line in the Y-axis direction) in which the third electrode pads 133 and 134 and the fourth electrode pad 142 are provided at the same position in the X-axis direction. Therefore, the distance between the electrode pads is able to be ensured, and unwanted coupling is significantly reduced or prevented.

The third electrode pad 133 is adjacent to the ground electrode 152 and a portion of the ground electrode 1551. The third electrode pad 134 is adjacent to the ground electrode 152 and a portion of the ground electrode 1551. The fourth electrode pad 142 is surrounded by the ground electrode 152 and the portion of the ground electrode 1551.

A portion of the outer periphery of the third electrode pads 133 and 134 and a portion of the outer periphery of the fourth electrode pad 142, in the plan view, are surrounded by the ground electrode 152 or the ground electrode 1551. In other words, each of the outer peripheries of the third electrode pads 133 and 134 and the fourth electrode pad 142 includes a portion that is not surrounded by the ground electrode 152 and the ground electrode 1551.

More specifically, the ground electrode 152 or the ground electrode 1551 is not provided in at least a portion of a region between the third electrode pad 133 and the fourth electrode pad 142 and at least a portion of a region between the third electrode pad 134 and the fourth electrode pad 142.

Structures in the first region and the second region of the external connection portion 102 will be compared. As described above, the leakage of the electric field of the signal of the third frequency and the fourth frequency is smaller than the leakage of the electric field of the signal of the first frequency and the second frequency. In such a case, the signal of the third frequency and the fourth frequency is more difficult to spread than the signal of the first frequency and the second frequency. Then, even when the third electrode pads 133 and 134 and the fourth electrode pad 142 are disposed close to each other, coupling between the electrode pads is difficult to occur in the case of the signal of the third frequency and the fourth frequency.

However, the third electrode pads 133 and 134 and the fourth electrode pad 142 are close to each other, and, further, the ground electrode is disposed between the third electrode pads 133 and 134 and the fourth electrode pad 142, a distance between the ground electrode and the electrode pads is reduced, and so as not to be partially disposed between the third electrode pads 133 and 134 and the fourth electrode pad 142 in order to significantly reduce or prevent the capacitive coupling from increasing. In other words, even when the distance between the third electrode pads 133 and 134 and the fourth electrode pad 142 in the second region is short, the ground electrode is not disposed between the third electrode pads 133 and 134 and the fourth electrode pad 142, so that deterioration of characteristics is able to be significantly reduced or prevented. Furthermore, even when an area of the second region is small, a large number of electrode pads (the third electrode pads 133 and 134, and the fourth electrode pad 142) is able to be disposed.

With such a configuration, an area of the ground electrodes 152 and 1551 in the second region is able to be reduced. As a result, the second region of the external connection portion 102 is able to be reduced in size.

In addition, even when a distance between the third electrode pads 133 and 134 and the fourth electrode pad 142 is reduced, the deterioration of characteristics is small. As a result, the distance between the third electrode pad 132 and the fourth electrode pad 142 is reduced, so that a large number of the third electrode pads 133 and 134 and the fourth electrode pads 142 are able to be disposed in the second region.

Configuration of Transmission Line 10

A more specific configuration of the transmission line 10 will be described. As shown in FIG. 3, FIG. 4, and FIG. 5, the transmission line 10 includes a first layer L1, a second layer L2, a third layer L3, a fourth layer L4, and a fifth layer L5 that are stacked.

As described above, the first electrode pads 111 and 112, the second electrode pads 121 and 122, the third electrode pads 131, 132, 133, and 134, the fourth electrode pads 141 and 142, and the ground electrodes 151, 152, and 1551 are provided on the first layer L1.

Interlayer connection conductors 1111, 1121, 1211, 1221, 1311, 1321, 1331, 1341, 1411, and 1421, and ground electrodes 151, 152, and 1551 are provided in the first layer L1. In addition, a plurality of interlayer connection conductors 701 are provided in the first layer L1. The interlayer connection conductors 1111, 1121, 1211, 1221, 1311, 1321, 1331, 1341, 1411, and 1421 and the interlayer connection conductors 701 are provided, for example, by filling a through hole with conductive paste and solidifying the conductive paste.

Connection pads 301, 303, 304, 305, 307, and 308, a ground electrode 1552, a signal line 210, and a signal line 220 are provided on the second layer L2. Interlayer connection conductors 1312, 1322, 1332, 1342, 1412, and 1422 and a plurality of interlayer connection conductors 702 are provided in the second layer L2. The interlayer connection conductors 1312, 1322, 1332, 1342, 1412, and 1422 and the interlayer connection conductors 702 are provided, for example, by filling a through hole with conductive paste and solidifying the conductive paste.

The signal line 210 and the signal line 220 are the same or substantially the same band-shaped (linear) conductors and disposed parallel or substantially parallel to each other. The signal line 210 corresponds to the "first signal line", and the signal line 220 corresponds to the "second signal line".

Connection pads 311, 313, 314, 315, 317, and 318 and a ground electrode 1553 are provided on the third layer L3. In addition, interlayer connection conductors 1313, 1323, 1333, 1343, 1413, 1423, 1513, and 1523, and a plurality of interlayer connection conductors 703 are provided in the third layer L3. The interlayer connection conductors 1313, 1323, 1333, 1343, 1413, 1423, 1513, and 1523, and the interlayer connection conductor 703 are provided, for example, by filling a through hole with conductive paste and solidifying the conductive paste.

The fourth layer L4 includes a signal line 410, a signal line 420, a signal line 430, and a ground electrode 1554. In addition, a plurality of interlayer connection conductors 704 are provided in the fourth layer L4, and the interlayer connection conductor 704 are provided, for example, by filling a through hole with conductive paste and solidifying the conductive paste. The signal line 410 and the signal line 430 are the same or substantially the same band-shaped (linear) conductors. The signal line 410, the signal line 420, and the signal line 430 are disposed parallel or substantially parallel to each other.

Either of the signal lines 410, 420, and 430 corresponds to the "third signal line" or the "fourth signal line".

The fifth layer L5 includes a ground electrode 1555.

In FIG. 3, FIG. 4, and FIG. 5, in order to make the drawings easy to see, the interlayer connection conductors 701, 702, 703, and 704 for grounding in the external connection portions 101 and 102 are omitted.

Connection Structure of First Electrode Pads 111, 112 and Signal Line 210

The interlayer connection conductor 1111 is connected to the first electrode pad 111. The interlayer connection conductor 1121 is connected to the first electrode pad 112.

One end of the signal line 210 is connected to the first electrode pad 111 through the interlayer connection conductor 1111. In addition, the other end of the signal line 210 is connected to the first electrode pad 112 through the interlayer connection conductor 1121. As a result, the signal line 210 connects the first electrode pad 111 and the first electrode pad 112 at both ends of the transmission line 10.

Connection Structure of Second Electrode Pads 121, 122 and Signal Line 220

The interlayer connection conductor 1211 is connected to the second electrode pad 121. The interlayer connection conductor 1221 is connected to the second electrode pad 122.

One end of the signal line 220 is connected to the second electrode pad 121 through the interlayer connection conductor 1211. In addition, the other end of the signal line 220 is connected to the second electrode pad 122 through the interlayer connection conductor 1221. As a result, the signal line 220 connects the second electrode pad 121 and the second electrode pad 122 at both ends of the transmission line 10.

Connection Structure of Third Electrode Pads 131, 133 and Signal Line 410

The third electrode pad 131 is connected to the connection pad 301 through the interlayer connection conductor 1311. The connection pad 301 is connected to the connection pad 311 through the interlayer connection conductor 1312. The connection pad 311 is connected to one end of the signal line 410 through the interlayer connection conductor 1313.

In addition, the third electrode pad 133 is connected to the connection pad 305 through the interlayer connection conductor 1331. The connection pad 305 is connected to the connection pad 315 through the interlayer connection conductor 1332. The connection pad 315 is connected to the other end of the signal line 410 through the interlayer connection conductor 1333.

As a result, the signal line 410 connects the third electrode pad 131 and the third electrode pad 133 at both ends of the transmission line 10.

Connection Structure of Third Electrode Pads 132, 134 and Signal Line 430

The third electrode pad 132 is connected to the connection pad 303 through the interlayer connection conductor 1321. The connection pad 303 is connected to the connection pad 313 through the interlayer connection conductor 1322. The connection pad 313 is connected to one end of the signal line 430 through the interlayer connection conductor 1323.

In addition, the third electrode pad 134 is connected to the connection pad 307 through the interlayer connection conductor 1341. The connection pad 307 is connected to the connection pad 317 through the interlayer connection conductor 1342. The connection pad 317 is connected to the other end of the signal line 430 through the interlayer connection conductor 1343.

As a result, the signal line 430 connects the third electrode pad 132 and the third electrode pad 134 at both ends of the transmission line 10.

Connection Structure of Fourth Electrode Pads 141, 142 and Signal Line 420

The fourth electrode pad 141 is connected to the connection pad 304 through the interlayer connection conductor 1411. The connection pad 304 is connected to the connection pad 314 through the interlayer connection conductor 1412. The connection pad 314 is connected to one end of the signal line 420 through the interlayer connection conductor 1413.

In addition, the fourth electrode pad 142 is connected to the connection pad 308 through the interlayer connection conductor 1421. The connection pad 308 is connected to the connection pad 318 through the interlayer connection conductor 1422. The connection pad 318 is connected to the other end of the signal line 420 through the interlayer connection conductor 1423.

As a result, the signal line 420 connects the fourth electrode pad 141 and the fourth electrode pad 142 at both ends of the transmission line 10.

In the above described configuration, the third electrode pads 131, 132, 133, and 134 are closer to the first end E1 (the end portion of the transmission line 10) than the fourth electrode pads 141 and 142.

In such a case, when a frequency of a high-frequency signal to be transmitted through the signal lines 410 and 430 is different from a frequency of a high-frequency signal to be transmitted through the signal line 420, a frequency of a transmission line to be connected to the third electrode pads 131, 132, 133, and 134 is preferably lower than a frequency of a transmission line to be connected to the fourth electrode pads 141 and 142. More specifically, the frequency of the signal lines 410 and 430 is preferably lower than the frequency of the signal line 420.

With such a configuration, a transmission loss in the signal line 420 is able to be significantly reduced or prevented, and, further, unnecessary coupling between the signal lines and between the ground electrodes is able to be significantly reduced or prevented.

Connection Structure of Ground Electrode 151

The ground electrode 151 is connected to an interlayer connection conductor 1511 in the first layer L1. The ground electrode 1552 is connected to an interlayer connection conductor 1512 in the second layer L2. The ground electrode 1553 is connected to the interlayer connection conductor 1513 in the third layer L3.

The ground electrode 151 is connected to the ground electrode 1552 through the interlayer connection conductor 1511. The ground electrode 1552 is connected to the ground electrode 1553 through the interlayer connection conductor 1512. The ground electrode 1553 is connected to the ground electrode 1554 through the interlayer connection conductor 1513.

Connection Structure of Ground Electrode 152

The ground electrode 152 is connected to an interlayer connection conductor 1521 in the first layer L1. The ground electrode 1552 is connected to an interlayer connection conductor 1522 in the second layer L2. The ground electrode 1553 is connected to the interlayer connection conductor 1523 in the third layer L3.

The ground electrode 152 is connected to the ground electrode 1552 through the interlayer connection conductor 1521. The ground electrode 1552 is connected to the ground electrode 1553 through the interlayer connection conductor 1522. The ground electrode 1552 is connected to the ground electrode 1554 through the interlayer connection conductor 1523.

Connection Structure of Other Interlayer Connection Conductors for Grounding The interlayer connection conductor 701 in the ground electrode 1551 of the first layer L1 is connected to the ground electrode 1552 of the second layer L2. The interlayer connection conductor 702 in the ground electrode 1552 of the second layer L2 is connected to the ground electrode 1553 of the third layer L3. The interlayer connection conductor 703 in the ground electrode 1553 of the third layer L3 is connected to the ground electrode 1554 of the fourth layer L4. The interlayer connection conductor 704 in the ground electrode 1554 of the fourth layer L4 is connected to the ground electrode 1555 of the fifth layer L5.

As described above, the interlayer connection conductors 701, 702, 703, and 704 are configured so that emission of noise from each of the signal lines 210, 220, 410, 420, and 430 of the transmission line 10 to the outside is able to be significantly reduced or prevented.

Exposed Area of Electrode Pad

With use of the external connection portion 101 shown in FIG. 6, a configuration in which a protective layer 600 is provided on the transmission line 10 will be described. It is to be noted that, in FIG. 6, openings 601, 602, 603, 604, 605, and 606 are indicated by a solid line. The protective layer 600 includes the openings 601, 602, 603, 604, 605, and 606 in the external connection portion 101. The opening 601 overlaps the first electrode pad 111 in the plan view. The opening 602 overlaps the second electrode pad 121 in the plan view. The opening 603 overlaps the third electrode pad 131 in the plan view. The opening 604 overlaps the third electrode pad 132 in the plan view. The opening 605 overlaps the ground electrodes 151 and 1551 in the plan view. The opening 606 overlaps the fourth electrode pad 141 in the plan view.

The opening 601 has the same or substantially the same shape as the first electrode pad 111. The opening 602 has the same or substantially the same shape as the second electrode pad 121. The opening 603 is smaller than the third electrode pad 131. The opening 604 is smaller than the third electrode pad 132. The opening 603 has the same or substantially the same shape as the openings 604, 605, and 606. The opening 606 is smaller than the fourth electrode pad 141.

Such a protective layer 600 is provided, so that a short circuit between electrode pads when the transmission line 10 is mounted on a circuit board with solder or the like is able to be significantly reduced or prevented. In addition, with the above described configuration in which the openings are provided in the protective layer 600, a bonding area between the first electrode pad 111 and the second electrode pad 121 is able to be increased when the transmission line 10 is mounted. On the other hand, in the third electrode pads 131 and 132, the fourth electrode pad 141, and the ground electrodes 151 and 1551, even when a distance between the third electrode pads 131 and 132 and the fourth electrode pad 141 is short, by the openings 602, 603, 604, and 605, the short circuit between the above described electrode pads when the transmission line 10 is mounted is significantly reduced or prevented, which is able to ensure isolation.

FIG. 7 is a cross-sectional view along a line X1-X1 in FIG. 6. The line X1-X1 in FIG. 6 passes the third electrode pad 131, the first electrode pad 111, and the signal line 210 in the first layer L1 and the second layer L2, and passes the third electrode pad 131, the first electrode pad 111, and the signal line 410 in the first layer L1, the second layer L2, the third layer L3, and the fourth layer L4.

As shown in FIG. 7, the signal line 210 is disposed closer to the first main surface S1 than the signal line 410, and is connected to an electrode pad on the first main surface S1 using each interlayer connection conductor extending in a thickness direction.

In other words, a length (hereinafter referred to as a first transmission line length) from the signal line 210 that transmits the signal of the first frequency and the second frequency to the first electrode pad 111 is shorter than a length (hereinafter referred to as a second transmission line length) from the signal line 410 that transmits the signal of the third frequency and the fourth frequency to the third electrode pad 131. More specifically, the first transmission line length is shorter by a length of the interlayer connection conductor 1312 and the interlayer connection conductor 1313 than the second transmission line length.

Interlayer connection conductors, because of a thin line width, being made of a material with a high conductor resistance for connection, and being difficult to shield a periphery of the transmission line, are susceptible to external influences. However, with such a configuration, a line length of the transmission line of a high-frequency signal of the first frequency and the second frequency with a high frequency is able to be shorter than a line length of the transmission line of a high-frequency signal of the third frequency and the fourth frequency, and the above-described adverse influences are able to be significantly reduced or prevented, and a transmission loss (an insertion loss) of the transmission line of a high-frequency signal of the first frequency and the second frequency, which is particularly susceptible, is able to be reduced. Furthermore, since the first transmission line length is shorter than the second transmission line length, a loss due to impedance mismatching is able to be reduced.

FIG. 8 is a perspective view in which the transmission line 10 is mounted on a circuit board 50. The electronic device 1 includes a transmission line 10, surface mount components 81 and 82, and a circuit board 50.

The transmission line 10 is directly mounted on the circuit board 50, using a conductive bonding material, such as solder, for example. More specifically, the first electrode pads 111 and 112, the second electrode pads 121 and 122, the third electrode pads 131, 132, 133, and 134, and the fourth electrode pads 141 and 142 are mounted on the circuit board 50 through solder or a suitable material, for example.

With such a configuration, the transmission line 10 is reduced in size, and is able to be disposed in a small space while avoiding the surface mount components. In addition, even when the number of signal lines (the number of electrode pads) is increased and the distance between the electrode pads is short, the electronic device 1 using the transmission line that significantly reduces or prevents unnecessary coupling is obtained without increasing a size of the external connection portions 101 and 102.

Second Preferred Embodiment

Figure 9:
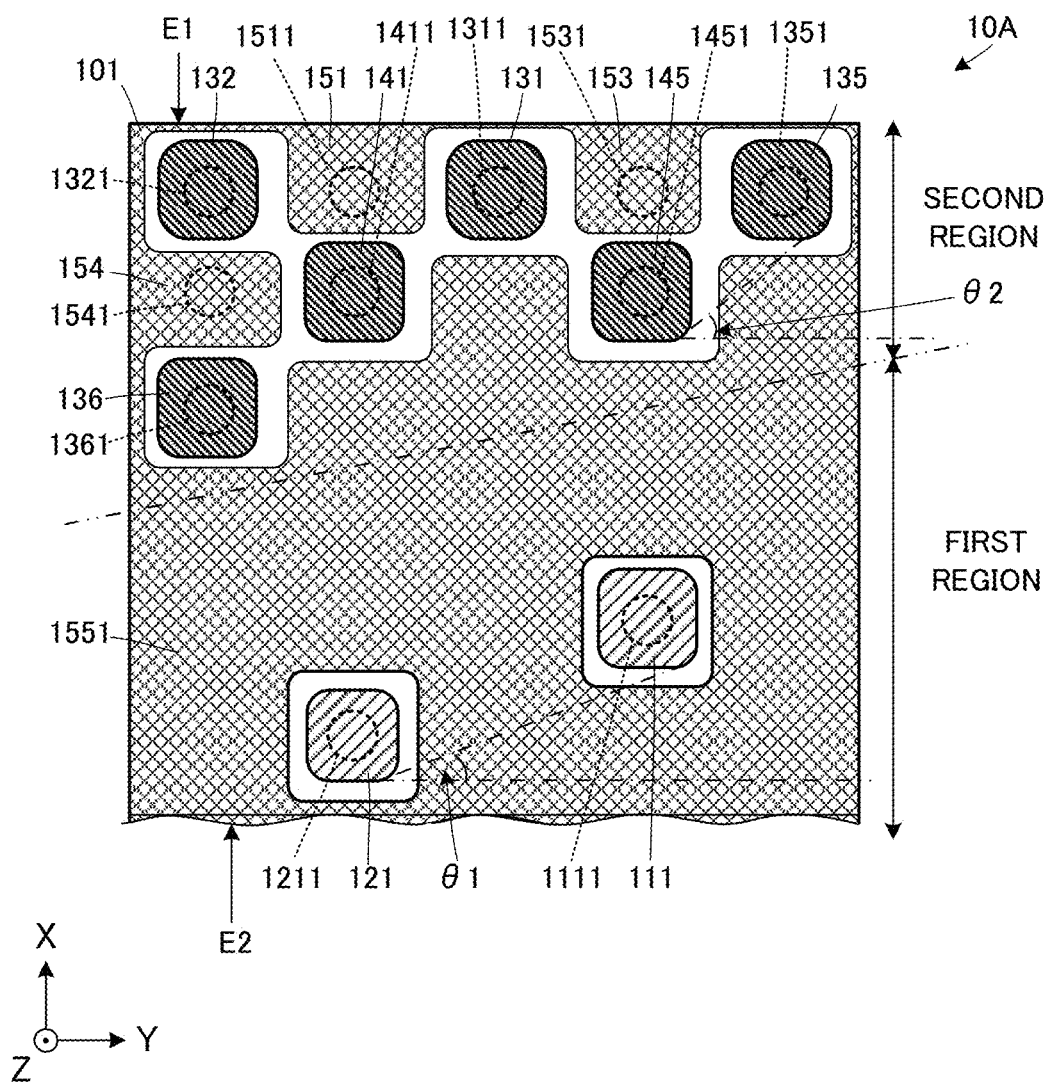
FIG. 9 is a plan view showing an external connection portion 101 of a transmission line 10A according to a second preferred embodiment of the present invention.
Figure 11:
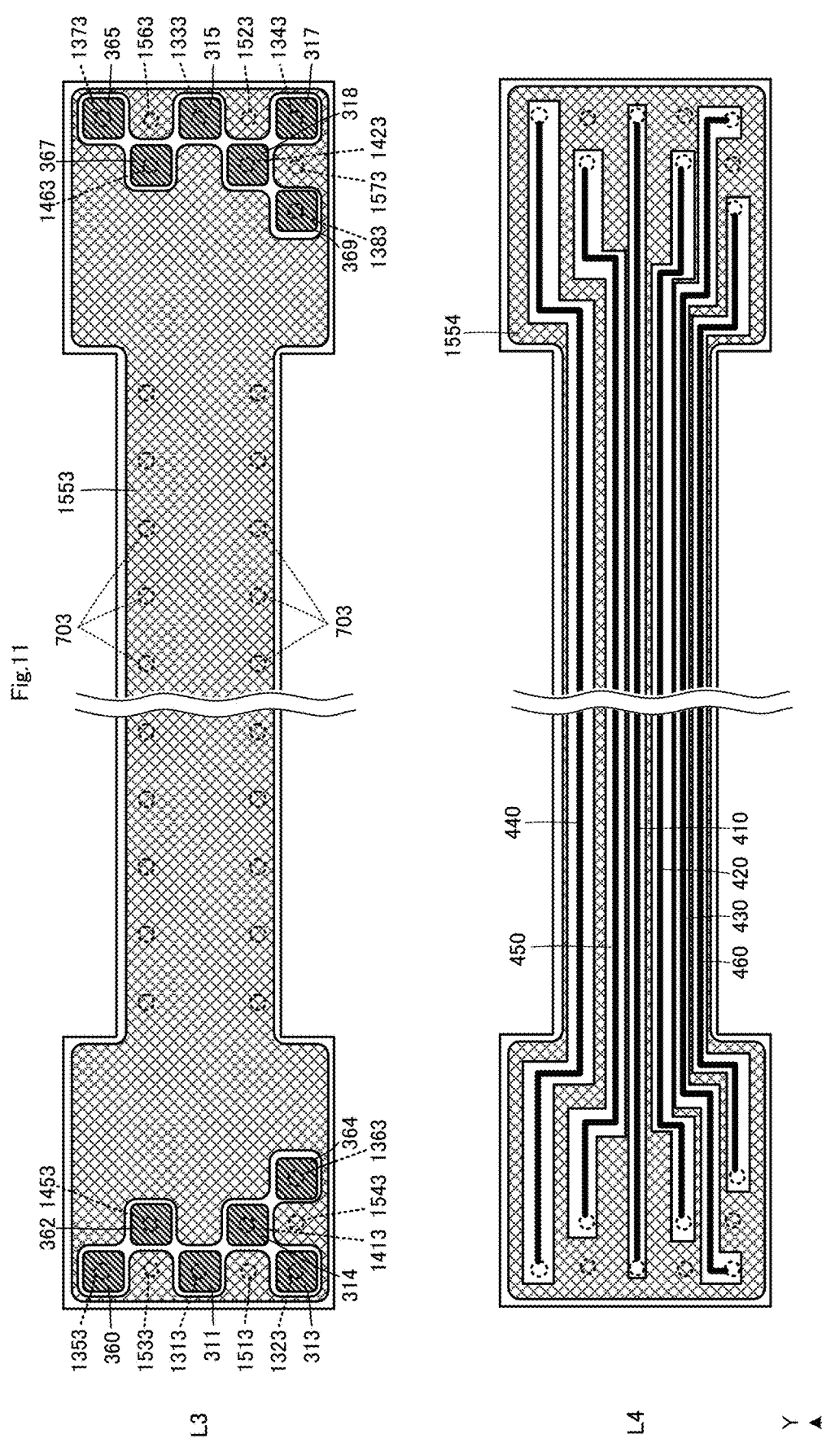
FIG. 11 is an exploded plan view of a third layer L3 and a fourth layer L4 in the transmission line 10A according to the second preferred embodiment of the present invention.

A transmission line according to a second preferred embodiment of the present invention will be described with reference to the drawings. FIG. 9 is a plan view showing an external connection portion 101 of a transmission line 10A according to the second preferred embodiment of the present invention. FIG. 10 is an exploded plan view of a first layer L1 and a second layer L2 in the transmission line 10A according to the second preferred embodiment. FIG. 11 is an exploded plan view of a third layer L3 and a fourth layer L4 in the transmission line 10A according to the second preferred embodiment. It is to be noted that, in FIG. 10, in order to make the drawing easy to see, the interlayer connection conductor 704 in the fifth layer L5 and the fourth layer L4 is omitted.

The transmission line 10A according to the present preferred embodiment is different from the transmission line 10 according to the first preferred embodiment in that third electrode pads 135 and 136 are provided in the external connection portion 101, in that third electrode pads 137 and 138 are provided in the external connection portion 102, in that a fourth electrode pad 145 is provided in the external connection portion 101, in that a fourth electrode pad 146 is provided in the external connection portion 102, in that ground electrodes 153, 154, 156, and 157 are provided, in that signal lines 440, 450, and 460 are provided, in that a plurality of connection pads and interlayer connection conductors in connection with such differences, in a positional relationship between the first electrode pad 111 and the second electrode pad 121 in the external connection portion 101, in a positional relationship between the first electrode pad 112 and the second electrode pad 122 in the external connection portion 102, and in that a boundary line between the first region and the second region is not parallel or substantially parallel to each other in the Y-axis direction. Other configurations of the transmission line 10A are the same or substantially the same as the configurations of the transmission line 10 according to the first preferred embodiment, and thus a description of the same or similar configurations will be omitted.

A first electrode pad 111, a second electrode pad 121, and a ground electrode 1551 are provided in the first region of the external connection portion 101. Third electrode pads 131, 132, 135, and 136, fourth electrode pads 141 and 145, ground electrodes 151, 153, and 154, and a ground electrode 1551 are provided in the second region. The ground electrodes 151, 153, and 154 and the ground electrode 1551 are connected by an electrode provided along an outer periphery.

A first electrode pad 112, a second electrode pad 122, and a ground electrode 1551 are provided in the first region of the external connection portion 102. Third electrode pads 133, 134, 137, and 138, fourth electrode pads 142 and 146, ground electrodes 152, 156, and 157, and a ground electrode 1551 are provided in the second region. The ground electrodes 152, 156, and 157 and the ground electrode 1551 are connected by an electrode provided along an outer periphery.

Structure of First Region

First, a structure of the external connection portion 101 will be described. The first electrode pad 111 and the second electrode pad 121 are disposed with a predetermined distance therebetween, in the first region. Each of the outer periphery of the first electrode pad 111 and the outer periphery of the second electrode pad 121, in a plan view, is surrounded by the ground electrode 1551 with a predetermined distance therebetween.

The first electrode pad 111 and the second electrode pad 121 are provided at different positions in the X-axis direction (the first direction) and the Y-axis direction (the second direction).

Each of the first electrode pad 111 and the second electrode pad 121 is surrounded over the entire or substantially the entire periphery by the ground electrode 1551, so that sufficient isolation of a transmission line that transmits a signal of the first frequency and the second frequency is able to be ensured.

Next, a structure of the external connection portion 102 will be described. The first electrode pad 112 and the second electrode pad 122 are disposed with a predetermined distance therebetween, in the first region. Each of the outer periphery of the first electrode pad 112 and the outer periphery of the second electrode pad 122, in the plan view, is surrounded by the ground electrode 1551 with a predetermined distance therebetween.

The first electrode pad 112 and the second electrode pad 122 are provided at different positions in the X-axis direction (the first direction) and the Y-axis direction (the second direction).

Each of the first electrode pad 112 and the second electrode pad 122 is surrounded over the entire or substantially the entire periphery by the ground electrode 1551, so that sufficient isolation of a transmission line that transmits a signal of the first frequency and the second frequency is able to be ensured.

The first electrode pad 111 and the second electrode pad 121, and the first electrode pad 112 and the second electrode pad 122 are provided at different positions in the X-axis direction and the Y-axis direction, so that a distance between the first electrode pad 111 and the second electrode pad 121 and a distance between the first electrode pad 112 and the second electrode pad 122 are increased, in comparison with a case in which the electrodes are formed at the same position in the X-axis direction. Therefore, the distance between the electrode pads is able to be ensured, and unwanted coupling is significantly reduced or prevented.

Structure of Second Region

In the second region of the external connection portion 101, the third electrode pads 131, 132, 135, and 136 and the fourth electrode pads 141 and 145 are disposed with a predetermined distance therebetween.

In the second region of the external connection portion 102, the third electrode pads 133, 134, 137, and 138 and the fourth electrode pads 142 and 146 are disposed with a predetermined distance therebetween.

First, a structure of the external connection portion 101 will be described. In the Y-axis direction of the external connection portion 101, components are provided in order of the third electrode pad 132, the ground electrode 151, the third electrode pad 131, the ground electrode 153, and the third electrode pad 135.

Similarly, in the Y-axis direction of the external connection portion 101, components are provided in order of the ground electrode 154, the fourth electrode pads 141, a portion of the ground electrode 1551, the fourth electrode pad 145, and a portion of the ground electrode 1551. In addition, the third electrode pad 136 is provided near the second end E2 of the ground electrode 154.

In other words, the third electrode pad 131 is adjacent to the ground electrode 151, the ground electrode 153, and a portion of the ground electrode 1551. The third electrode pad 132 is adjacent to the ground electrode 151 and the ground electrode 154. The third electrode pad 135 is adjacent to the ground electrode 153 and a portion of the ground electrode 1551.

The fourth electrode pad 141 is surrounded by the ground electrode 151, the ground electrode 154, and the portion of the ground electrode 1551. The fourth electrode pad 145 is surrounded by the ground electrode 153 and the portion of the ground electrode 1551. The third electrode pad 136 is surrounded by the ground electrode 154 and the portion of the ground electrode 1551.

In such a case, the third electrode pads 131, 132, and 135 and the fourth electrode pads 141 and 145 are provided at different positions in the X-axis direction (the first direction) and the Y-axis direction (the second direction). In addition, the fourth electrode pads 141 and 145 and the third electrode pad 136 are provided at different positions in the X-axis direction (the first direction) and the Y-axis direction (the second direction).

Therefore, a distance between the third electrode pads 131, 132, and 135 and the fourth electrode pads 141 and 145 and a distance between the fourth electrode pads 141 and 145 and the third electrode pad 136 are able to be sufficiently ensured.

Next, a structure of the external connection portion 102 will be described. In the Y-axis direction of the external connection portion 102, components are provided in order of the third electrode pad 134, the ground electrode 152, the third electrode pad 133, the ground electrode 156, and the third electrode pad 137.

Similarly, in the Y-axis direction of the external connection portion 102, components are provided in order of the ground electrode 157, the fourth electrode pads 142, a portion of the ground electrode 1551, the fourth electrode pad 146, and a portion of the ground electrode 1551. In addition, the third electrode pad 138 is formed near the second end E2 of the ground electrode 157.

In other words, the third electrode pad 134 is adjacent to the ground electrode 152 and the ground electrode 157. The third electrode pad 133 is adjacent to the ground electrode 152, a portion of the ground electrode 1551, and the ground electrode 156. The third electrode pad 137 is adjacent to a portion of the ground electrode 1551, and the ground electrode 156.

The fourth electrode pad 142 is surrounded by the ground electrode 152, a portion of the ground electrode 1551, and the ground electrode 157. The fourth electrode pad 146 is surrounded by a portion of the ground electrode 1551, and the ground electrode 156.

The third electrode pad 138 is surrounded by a portion of the ground electrode 1551, and the ground electrode 157.

In such a case, the third electrode pads 133, 134, and 137 and the fourth electrode pads 142 and 146 are provided at different positions in the X-axis direction (the first direction) and the Y-axis direction (the second direction). In addition, the fourth electrode pads 142 and 146 and the third electrode pad 138 are provided at different positions in the X-axis direction (the first direction) and the Y-axis direction (the second direction).

Therefore, a distance between the third electrode pads 133, 134, and 137 and the fourth electrode pads 142 and 146 and a distance between the fourth electrode pads 142 and 146 and the third electrode pad 138 are able to be sufficiently ensured.

In the above described configuration, each of the outer periphery of the third electrode pads 131, 132, 133, 134, 135, 136, 137, and 138 includes a portion that is not surrounded by the ground electrodes 151, 152, 153, 154, 156, 157, and 1551. Similarly, each of the outer periphery of the fourth electrode pads 141, 142, 145, and 146 includes a portion that is not surrounded by the ground electrodes 151, 152, 153, 154, 156, 157, and 1551.

Structures in the first region and the second region will be compared. Leakage of an electric field of a signal of the third frequency and the fourth frequency is smaller than leakage of an electric field of the signal of the first frequency and the second frequency. In such a case, the signal of the third frequency and the fourth frequency is more difficult to spread than the signal of the first frequency and the second frequency. Then, even when the third electrode pads 131, 132, 133, 134, 135, 136, 137, and 138 and the fourth electrode pads 141, 142, 145, and 146 are disposed close to each other, coupling between the electrode pads is difficult to occur in the case of the signal of the third frequency and the fourth frequency.

However, the third electrode pads 131, 132, 133, 134, 135, 136, 137, and 138 and the fourth electrode pads 141, 142, 145, and 146 are close to each other, and, further, the ground electrode is disposed between the third electrode pads 131, 132, 133, 134, 135, 136, 137, and 138 and the fourth electrode pads 141, 142, 145, and 146, a distance between the ground electrode and the electrode pads is reduced, and capacitive coupling increases. The ground electrode is configured so as not to be partially disposed in order to significantly reduce or prevent the capacitive coupling from increasing. In other words, even when the distance between the third electrode pads 131, 132, 133, 134, 135, 136, 137, and 138 and the fourth electrode pads 141, 142, 145, and 146 in the second region is short, the ground electrode is not disposed between the third electrode pads 131, 132, 133, 134, 135, 136, 137, and 138 and the fourth electrode pads 141, 142, 145, and 146, so that deterioration of characteristics is able to be significantly reduced or prevented. Furthermore, even when an area of the second region is small, a large number of electrode pads (the third electrode pads 131, 132, 133, 134, 135, 136, 137, and 138, and the fourth electrode pads 141, 142, 145, and 146) are able to be provided.

With such a configuration, an area of the ground electrodes 151, 152, 153, 154, 156, 157, and 1551 in the second region is able to be reduced. As a result, the second region is able to be reduced in size.

In addition, even when a distance between the third electrode pads 131, 132, 133, 134, 135, 136, 137, and 138 and the fourth electrode pads 141, 142, 145, and 146 is reduced, the deterioration of characteristics is small. As a result, the distance between the third electrode pads 131 and 132 and the fourth electrode pads 141, 142, 145, and 146 is reduced, so that a large number of the third electrode pads 131 and 132 and the fourth electrode pads 141, 142, 145, and 146 are able to be disposed in the second region.

Positional Relationship Between Electrode Pads

The positional relationship between the electrode pads provided in the first region and the second region will be more specifically described with reference to FIG. 9. The first electrode pad 111, the second electrode pad 121, the third electrode pad 135, and the fourth electrode pad 145 will be described as an example. It is to be noted that, as shown in FIG. 9, the boundary line between the first region and the second region is not parallel or substantially parallel to the Y-axis direction. With this configuration, the second region is able to be reduced in size.

An angle between a straight line that connects the first electrode pad 111 and the second electrode pad 121 and a straight line parallel or substantially parallel to the Y-axis direction is referred to as θ1, and an angle between a straight line that connects the third electrode pad 135 and the fourth electrode pad 145 and a straight line parallel or substantially parallel to the Y-axis direction is referred to as θ2.

In such a case, the first electrode pad 111, the second electrode pad 121, the third electrode pad 135, and the fourth electrode pad 145 are preferably disposed so that the angle θ1 and the angle θ2 may be the same or substantially the same value. As a result, a distance between the first electrode pad 111 and the second electrode pad 121, and the third electrode pad 135 and the fourth electrode pad 145 is able to be sufficiently ensured, and coupling between the transmission line of a high-frequency signal of the first frequency and the second frequency and the transmission line of a high-frequency signal of the third frequency and the fourth frequency is able to be significantly reduced or prevented.

Configuration of Transmission Line 10A

Subsequently, a configuration of the transmission line 10A will be described. As shown in FIG. 10 and FIG. 11, the transmission line 10A includes a first layer L1, a second layer L2 a third layer L3, a fourth layer L4, and a fifth layer L5 that are stacked (not shown).

Interlayer connection conductors 1111, 1211, 1311, 1321, 1351, 1361, 1411, 1451, 1511, 1531, and 1541 are provided in the external connection portion 101 of the first layer L1. The interlayer connection conductors 1111, 1211, 1311, 1321, 1351, 1361, 1411, 1451, 1511, 1531, and 1541 are provided, for example, by filling a through hole with conductive paste and solidifying the conductive paste.

Interlayer connection conductors 1121, 1221, 1331, 1341, 1371, 1381, 1421, 1461, 1521, 1561, and 1571 are provided in the external connection portion 102 of the first layer L1. The interlayer connection conductors 1121, 1221, 1331, 1341, 1371, 1381, 1421, 1461, 1521, 1561, and 1571 are provided, for example, by filling a through hole with conductive paste and solidifying the conductive paste.

Connection pads 301, 303, 304, 350, 352, and 354, a signal line 210, and a signal line 220 are provided on the external connection portion 101 of the second layer L2. In addition, interlayer connection conductors 1312, 1322, 1352, 1362, 1412, 1452, 1512, 1532, and 1542 are formed in the second layer L2. The interlayer connection conductors 1312, 1322, 1352, 1362, 1412, 1452, 1512, 1532, and 1542 are provided, for example, by filling a through hole with conductive paste and solidifying the conductive paste.

Connection pads 305, 307, 308, 355, 357, and 359, a signal line 210, and a signal line 220 are provided on the external connection portion 102 of the second layer L2. In addition, interlayer connection conductors 1332, 1342, 1382, 1422, 1462, 1522, 1562, and 1572 are provided in the second layer L2. The interlayer connection conductors 1332, 1342, 1372, 1382, 1422, 1462, 1522, 1562, and 1572 are provided, for example, by filling a through hole with conductive paste and solidifying the conductive paste.

Connection pads 311, 313, 314, 360, 362, and 364 are provided on the external connection portion 101 of the third layer L3. In addition, interlayer connection conductors 1313, 1323, 1353, 1363, 1413, 1453, 1513, 1533, and 1543 are provided in the third layer L3. The interlayer connection conductors 1313, 1323, 1353, 1363, 1413, 1453, 1513, 1533, and 1543 are provided, for example, by filling a through hole with conductive paste and solidifying the conductive paste.

Connection pads 315, 317, 318, 365, 367, and 369 are provided on the external connection portion 102 of the third layer L3. In addition, interlayer connection conductors 1333, 1343, 1373, 1383, 1423, 1463, 1523, 1563, and 1573 are provided in the third layer L3. The interlayer connection conductors 1333, 1343, 1373, 1383, 1423, 1463, 1523, 1563, and 1573 are provided, for example, by filling a through hole with conductive paste and solidifying the conductive paste.

The fourth layer L4 includes a signal line 410, a signal line 420, a signal line 430, a signal line 440, a signal line 450, and a signal line 460. The signal line 410, the signal line 420, the signal line 430, the signal line 440, the signal line 450, and the signal line 460 are disposed parallel or substantially parallel to one another.

Connection Structure of First Electrode Pad and Signal Line 210, and Second Electrode Pad and Signal Line 220

As shown in the above described preferred embodiment, the signal line 210 is connected to the first electrode pad 111 and the first electrode pad 112. The signal line 220 is connected to the second electrode pad 121 and the second electrode pad 122.

In addition, the signal line 410 is connected to the third electrode pad 131 and the third electrode pad 133. The signal line 420 is connected to the fourth electrode pad 141 and the fourth electrode pad 142. The signal line 430 is connected to the third electrode pad 132 and the third electrode pad 134.

Connection Structure of Third Electrode Pads 135, 137 and Signal Line 440

The third electrode pad 135 is connected to the connection pad 350 through the interlayer connection conductor 1351. The connection pad 350 is connected to the connection pad 360 through the interlayer connection conductor 1352. The connection pad 360 is connected to one end of the signal line 440 through the interlayer connection conductor 1353.

In addition, the third electrode pad 137 is connected to the connection pad 355 through the interlayer connection conductor 1371. The connection pad 355 is connected to the connection pad 365 through the interlayer connection conductor 1372. The connection pad 365 is connected to the other end of the signal line 440 through the interlayer connection conductor 1373.

As a result, the signal line 440 connects the third electrode pad 135 and the third electrode pad 137 at both ends of the transmission line 10A.

Connection Structure of Third Electrode Pads 136, 138 and Signal Line 460

The third electrode pad 136 is connected to the connection pad 354 through the interlayer connection conductor 1361. The connection pad 354 is connected to the connection pad 364 through the interlayer connection conductor 1362. The connection pad 364 is connected to one end of the signal line 460 through the interlayer connection conductor 1363.

In addition, the third electrode pad 138 is connected to the connection pad 359 through the interlayer connection conductor 1381. The connection pad 359 is connected to the connection pad 369 through the interlayer connection conductor 1382. The connection pad 369 is connected to the other end of the signal line 460 through the interlayer connection conductor 1383.

As a result, the signal line 460 connects the third electrode pad 136 and the third electrode pad 138 at both ends of the transmission line 10A.

Connection Structure of Fourth Electrode Pads 145, 146 and Signal Line 450

The fourth electrode pad 145 is connected to the connection pad 352 through the interlayer connection conductor 1451. The connection pad 352 is connected to the connection pad 362 through the interlayer connection conductor 1452. The connection pad 362 is connected to one end of the signal line 450 through the interlayer connection conductor 1453.

In addition, the fourth electrode pad 146 is connected to the connection pad 357 through the interlayer connection conductor 1461. The connection pad 357 is connected to the connection pad 367 through the interlayer connection conductor 1462. The connection pad 367 is connected to the other end of the signal line 450 through the interlayer connection conductor 1463.

As a result, the signal line 450 connects the fourth electrode pad 145 and the fourth electrode pad 146 at both ends of the transmission line 10A.

Connection Structure of Ground Electrode

As with the above described preferred embodiment, the ground electrode 151 is connected to the ground electrode 1552 through the interlayer connection conductor 1511. The ground electrode 1552 is connected to the ground electrode 1553 through the interlayer connection conductor 1512. The ground electrode 1553 is connected to the ground electrode 1554 through the interlayer connection conductor 1513.

In addition, the ground electrode 152 is connected to the ground electrode 1552 through the interlayer connection conductor 1521. The ground electrode 1552 is connected to the ground electrode 1553 through the interlayer connection conductor 1522. The ground electrode 1553 is connected to the ground electrode 1554 through the interlayer connection conductor 1523.

Connection Structure of Ground Electrode 153

The ground electrode 153 is connected to the interlayer connection conductor 1531 in the first layer L1. The ground electrode 1552 is connected to the interlayer connection conductor 1532 in the second layer L2. The ground electrode 1553 is connected to the interlayer connection conductor 1533 in the third layer L3.

The ground electrode 153 is connected to the ground electrode 1552 through the interlayer connection conductor 1531. The ground electrode 1552 is connected to the ground electrode 1553 through the interlayer connection conductor 1532. The ground electrode 1553 is connected to the ground electrode 1554 through the interlayer connection conductor 1533.

Connection Structure of Ground Electrode 154

The ground electrode 154 is connected to an interlayer connection conductor 1541 in the first layer L1. The ground electrode 1552 is connected to an interlayer connection conductor 1542 in the second layer L2. The ground electrode 1553 is connected to an interlayer connection conductor 1543 in the third layer L3.

The ground electrode 154 is connected to the ground electrode 1552 through the interlayer connection conductor 1541. The ground electrode 1552 is connected to the ground electrode 1553 through the interlayer connection conductor 1542. The ground electrode 1553 is connected to the ground electrode 1554 through the interlayer connection conductor 1543.

Connection Structure of Ground Electrode 156

The ground electrode 156 is connected to the interlayer connection conductor 1561 in the first layer L1. The ground electrode 1552 is connected to the interlayer connection conductor 1562 in the second layer L2. The ground electrode 1553 is connected to the interlayer connection conductor 1563 in the third layer L3.

The ground electrode 156 is connected to the ground electrode 1552 through the interlayer connection conductor 1561. The ground electrode 1552 is connected to the ground electrode 1553 through the interlayer connection conductor 1562. The ground electrode 1553 is connected to the ground electrode 1554 through the interlayer connection conductor 1563.

Connection Structure of Ground Electrode 157

The ground electrode 157 is connected to the interlayer connection conductor 1571 in the first layer L1. The ground electrode 1552 is connected to the interlayer connection conductor 1572 in the second layer L2. The ground electrode 1553 is connected to the interlayer connection conductor 1573 in the third layer L3.

The ground electrode 157 is connected to the ground electrode 1552 through the interlayer connection conductor 1571. The ground electrode 1552 is connected to the ground electrode 1553 through the interlayer connection conductor 1572. The ground electrode 1553 is connected to the ground electrode 1554 through the interlayer connection conductor 1573.

Even with such a configuration, a transmission line that significantly reduces or prevents unwanted coupling without increasing a size of the external connection portions 101 and 102 is able to be provided. Further, the first electrode pad 111 and the second electrode pad 121 are formed at different positions in the X-axis direction, so that the distance between the electrode pads is able to be ensured, and unwanted coupling is significantly reduced or prevented.

The number of first electrode pads, second electrode pads, third electrode pads, and fourth electrode pads in the above described configuration is an example, and the configuration may further include a plurality of electrode pads.

Third Preferred Embodiment

A transmission line according to a third preferred embodiment of the present invention will be described with reference to the drawings. FIG. 12A is a plan view showing an external connection portion 101B of a transmission line 10B according to the third preferred embodiment, FIG. 12B is a cross-sectional view of a first electrode pad 111, and FIG. 12C is a cross-sectional view of a third electrode pad 131.

The transmission line 10B according to the present preferred embodiment is different from the transmission line 10 according to the first preferred embodiment in that a width of the first electrode pads 111 and 112 and a width of the second electrode pads 121 and 122 are different from a width of the third electrode pads 131, 132, 133, 134, 135, 136, 137, and 138 and a width of the fourth electrode pads 141, 142, 145, and 146. Other configurations of the transmission line 10B are the same or substantially the same as the configurations of the transmission line 10 according to the first preferred embodiment, and thus a description of the same or similar configuration will be omitted.

The width of the first electrode pads 111 and 112 and the width of the second electrode pads 121 and 122 each correspond to a length of each electrode pad in the Y-axis direction. Similarly, the width of the third electrode pads 131, 132, 133, 134, 135, 136, 137, and 138 and the width of the fourth electrode pads 141, 142, 145, and 146 each correspond to a length of each electrode pad in the Y-axis direction.

Comparison of Shapes of First Electrode Pad and Third Electrode Pad

The width of the first electrode pads 111 and 112 and the width of the second electrode pads 121 and 122 are the same or substantially the same, and, in the present preferred embodiment, a width d1 of the first electrode pad 111 will be described as an example.

Similarly, the width of the third electrode pads 131, 132, 133, 134, 135, 136, 137, and 138 and the width of the fourth electrode pads 141, 142, 145, and 146 are the same or substantially the same, and, in the present preferred embodiment, a width d3 of the third electrode pad 131 will be described as an example.

The width d1 of the first electrode pad 111 is smaller than the width d3 of the third electrode pad 131. In other words, the width of the third electrode pad 131 to be connected to the signal line of the third frequency and the fourth frequency is smaller than the width of the first electrode pad 111 to be connected to the signal line of the first frequency and the second frequency that are higher than the third frequency and the fourth frequency.

First, a configuration of the first electrode pad 111 will be described with reference to FIG. 12B. The first electrode pad 111 is not covered with a protective layer 600. As a result, in the first electrode pad 111, an area in which solder or the like is provided is able to be increased. In such a case, the first electrode pad 111 and the second electrode pad 121 preferably have a clearance resist structure. As a result, a distance between the first electrode pad 111 and the second electrode pad 121 is able to be increased, and coupling between the first electrode pad 111 and the second electrode pad 121 is able to be significantly reduced or prevented. In addition, the first electrode pad 111 and the second electrode pad 121 are separated, so that, even when the opening 601 has the configuration shown in FIG. 12B, a short circuit between the first electrode pad 111 and the second electrode pad 121 due to solder or the like during mounting is difficult to occur.

Subsequently, a configuration of the third electrode pad 131 will be described with reference to FIG. 12C. The third electrode pad 131 is partially covered with (over-resisted by) the protective layer 600.

The third electrode pad 131 is closer to an end of the transmission line 10B than the first electrode pad 111. In other words, when an impact is applied to the transmission line 10B, the third electrode pad 131 is easily detached from the transmission line 10B. However, the third electrode pad 131 is partially covered by (over-resisted) the protective layer 600, which is able to significantly reduce or prevent detachment of the third electrode pad 131.

In addition, the third electrode pad 131 and the fourth electrode pad 141, although being close to each other, are over-resisted, so that a distance between a region of the third electrode pad 131 in which solder or the like is formed and a region of the fourth electrode pad 141 in which solder or the like is formed is able to be increased. Therefore, a short circuit between the third electrode pad 131 and the fourth electrode pad 141 due to solder or the like during mounting is able to be significantly reduced or prevented.

Furthermore, since the width d1 of the first electrode pad 111 is small, even when the outer periphery of the first electrode pad 111 is surrounded by the ground electrode 1551, a distance between the first electrode pad 111 and the ground electrode 1551 is able to be increased. In contrast, the width d3 of the third electrode pad 131 is large, so that detachment is able to be significantly reduced or prevented.

In addition, the third electrode pad 131 includes the portion that is not surrounded by the ground electrode 1551, which is able to be significantly reduce can reduce or prevent capacitive coupling. As a result, the characteristics of a high-frequency signal are improved.

Positional Relationship of First Electrode Pad, Second Electrode Pad, Third Electrode Pad, and Fourth Electrode Pad The positional relationship of the first electrode pad 111, the second electrode pad 121, the third electrode pad 131, and the fourth electrode pad 141 will be described with reference to FIG. 12A. In FIG. 12A, the external connection portion 101 will be described as an example, the external connection portion 102 has the same or substantially the same configuration.

A distance between the first electrode pad 111 and the second electrode pad 121 is referred to as W1. A distance between the first electrode pad 111 and the fourth electrode pad 141 is referred to as W2. A distance between the fourth electrode pad 141 and the third electrode pad 131 is referred to as W3.

In such a case, the first electrode pad 111, the second electrode pad 121, the third electrode pad 131, and the fourth electrode pad 141 are preferably disposed so that the distance W1, the distance W2, and the distance W3 satisfy the following Formula 1.

$$W3<W2<W1 \quad \text{(Formula 1)}$$

As described above, the first frequency and the second frequency of a high-frequency signal to be transmitted through the signal line connected to the first electrode pad 111 and the second electrode pad 121 are higher than the third frequency and the fourth frequency of a high-frequency signal to be transmitted through the signal line connected to the third electrode pads 131 and 132 and the fourth electrode pad 141. In other words, the first electrode pad 111 and the second electrode pad 121, as compared with the third electrode pad 131 and 132 and the fourth electrode pad 141, are easy to be coupled to each other.

However, the coupling of the first electrode pad 111 and the second electrode pad 121 is able to be significantly reduced or prevented by setting the distance W1 between the first electrode pad 111 and the second electrode pad 121 to be larger than the distance W2 and the distance W3.

In addition, in a case in which the third frequency and the fourth frequency are different from each other, the fourth frequency is set to be higher than the third frequency. In other words, a signal with a high frequency is transmitted to the fourth electrode pad 141 disposed at a position close to the first electrode pad 111, and a signal with a low frequency is transmitted to the third electrode pads 131 and 132. Therefore, coupling to signals of each frequency is able to be significantly reduced or prevented by disposing the third electrode pads 131 and 132 and the fourth electrode pad so as to satisfy W3<W2 in Formula 1.

The above described configuration is an example that the widths of the first electrode pad and the second electrode pad and the widths of the third electrode pad and the fourth electrode pad are the same or substantially the same, respectively. However, the width of each electrode pad may be different from each other. In such a case, an electrode pad with the largest width in the electrode pads in the first region may be compared with an electrode pad with the smallest width in the electrode pads in the second region.

Fourth Preferred Embodiment

A transmission line according to a fourth preferred embodiment of the present invention will be described with reference to the drawings. FIG. 13A is an external perspective view of a transmission line 10C according to the fourth preferred embodiment, and FIG. 13B is a side cross-sectional view in which the transmission line 10C is connected to a circuit board 50C1 and a circuit board 50C2.

The transmission line 10C according to the present preferred embodiment is different from the transmission line 10A according to the second preferred embodiment in that connectors 511, 512, 521, and 522 are provided. Other configurations of the transmission line 10C are the same or substantially the same as the configurations of the transmission line 10A according to the second preferred embodiment, and thus a description of the same or similar configuration will be omitted.

The connector 511 is provided in the first region of the external connection portion 101 in the transmission line 10C. In addition, the connector 521 is provided in the second region of the external connection portion 101. Similarly, the connector 512 is provided in the first region of the external connection portion 102 in the transmission line 10C. In addition, the connector 522 is provided in the second region of the external connection portion 102. The connectors 511 and 512 correspond to a "first connector", and the connectors 512 and 522 correspond to a "second connector".

The transmission line 10C is bonded to the circuit board 50C1 through the connectors 511 and 512. In addition, the transmission line 10C is bonded to the circuit board 50C2 through the connectors 521 and 522.

While this configuration obtains the same or substantially the same advantageous functions and effects as the advantageous functions and effects of the above-described preferred embodiments, and the transmission line 10C is further configured to use the connectors 511, 512, 521, and 522, the configuration to connect the transmission line 10C is not limited and is highly convenient.

Finally, the above described preferred embodiments are to be considered in all respects as illustrative and not restrictive. It is to be understood that variations and modifications will be apparent to those skilled in the art. The scope of the present disclosure is defined not by the foregoing preferred embodiments but by the following claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A transmission line comprising:
a plurality of layers stacked on each other;
a first signal line on any one of the plurality of layers;
a second signal line on any one of the plurality of layers;
a third signal line on any one of the plurality of layers;
a fourth signal line on any one of the plurality of layers;
a first electrode pad connected to the first signal line;
a second electrode pad connected to the second signal line;
a third electrode pad connected to the third signal line;
a fourth electrode pad connected to the fourth signal line; and
a ground electrode on any one of the plurality of layers; wherein
the plurality of layers are stacked and include a first main surface and a second main surface;
the plurality of layers include:
a line portion extending along the first signal line, the second signal line, the third signal line, and the fourth signal line and including a first end and a second end; and
a first external connection portion connected to the first end of the line portion;
the first electrode pad, the second electrode pad, the third electrode pad, and the fourth electrode pad are on the first main surface in the first external connection portion;
a first frequency of a high-frequency signal to be transmitted through the first signal line and a second frequency of a high-frequency signal to be transmitted through the second signal line are higher than a third frequency of a high-frequency signal to be transmitted through the third signal line and a fourth frequency of a high-frequency signal to be transmitted through the fourth signal line;
each of the first electrode pad and the second electrode pad is surrounded by the ground electrode, in a plan view in a stacking direction of the plurality of layers; and
at least a portion of the third electrode pad and the fourth electrode pad includes a portion that is not surrounded by the ground electrode in the plan view in the stacking direction.

2. The transmission line according to claim 1, wherein
a first direction parallel or substantially parallel to the first signal line or the second signal line, and a second direction perpendicular or substantially perpendicular to the first direction are defined in the first external connection portion; and
the first electrode pad and the second electrode pad are at different positions in the first direction and the second direction.

3. The transmission line according to claim 1, wherein
a third direction parallel or substantially parallel to the third signal line or the fourth signal line, and a fourth direction perpendicular or substantially perpendicular to the third direction are defined in the first external connection portion; and
the third electrode pad and the fourth electrode pad are at different positions in the third direction and the fourth direction.

4. The transmission line according to claim 3, wherein, at a position in which the third electrode pad and the fourth electrode pad are closest to each other, the third electrode pad and the fourth electrode pad are at different positions in the third direction and the fourth direction.

5. The transmission line according to claim 3, further comprising a portion in which the ground electrode is not provided, between the third electrode pad and the fourth electrode pad.

6. The transmission line according to claim 3, wherein the first main surface includes:
a first region in which the first electrode pad and the second electrode pad are provided; and
a second region in which the third electrode pad and the fourth electrode pad are provided;
the transmission line further includes a protective layer; and a portion of the third electrode pad and a portion of the fourth electrode pad are covered with the protective layer.

7. The transmission line according to claim 1, wherein the first signal line and the second signal line are closer to the first main surface than the third signal line and the fourth signal line.

8. The transmission line according to claim 1, wherein the first main surface includes:
    a first region in which the first electrode pad and the second electrode pad are provided; and
    a second region in which the third electrode pad and the fourth electrode pad are provided; and
    the second region is at a position closer to an end of the transmission line than the first region.

9. The transmission line according to claim 1, wherein the ground electrode includes a round chamfer.

10. The transmission line according to claim 1, wherein the first electrode pad is smaller than the third electrode pad and the fourth electrode pad; and
    the second electrode pad is smaller than the third electrode pad and the fourth electrode pad.

11. The transmission line according to claim 1, wherein each of the first electrode pad and the second electrode pad is surrounded by the ground electrode continuously provided on the first main surface, in the plan view in the stacking direction.

12. The transmission line according to claim 1, wherein
    each of the first electrode pad and the second electrode pad is surrounded by the ground electrode continuously provided on the first main surface, in the plan view in the stacking direction; and
    each of a portion of the third electrode pad and a portion of the fourth electrode pad is surrounded by the ground electrode continuously provided on the first main surface, in the plan view in the stacking direction.

13. The transmission line according to claim 1, wherein the plurality of layers include a second external connection portion connected to the second end of the line portion.

14. The transmission line according to claim 13, further comprising:
    a fifth electrode pad connected to the first signal line;
    a sixth electrode pad connected to the second signal line;
    a seventh electrode pad connected to the third signal line; and
    an eighth electrode pad connected to the fourth signal line; wherein
    the fifth electrode pad, the sixth electrode pad, the seventh electrode pad, and the eighth electrode pad are on the first main surface in the second external connection portion;
    each of the fifth electrode pad and the sixth electrode pad is surrounded by the ground electrode, in the plan view in the stacking direction of the plurality of layers; and
    at least a portion of the seventh electrode pad and the eighth electrode pad includes a portion that is not surrounded by the ground electrode, in the plan view in the stacking direction.

15. The transmission line according to claim 1, wherein a distance between the third electrode pad and the fourth electrode pad is shorter than a distance between the first electrode pad and the second electrode pad.

16. An electronic device comprising:
    the transmission line according to claim 1; and
    a circuit board; wherein
    the first electrode pad, the second electrode pad, the third electrode pad, and the fourth electrode pad are bonded to the circuit board by a conductive bonding material.

17. An electronic device comprising:
    the transmission line according to claim 1;
    a circuit board;
    a first connector on the first electrode pad and the second electrode pad; and
    a second connector on the third electrode pad and the fourth electrode pad; wherein
    the transmission line is connected to the circuit board through the first connector and the second connector.

18. The electronic device according to claim 16, wherein
    the first external connection portion extends in a first direction parallel or substantially parallel to the first signal line or the second signal line, and a second direction perpendicular or substantially perpendicular to the first direction; and
    the first electrode pad and the second electrode pad are at different positions in the first direction and the second direction.

19. The electronic device according to claim 16, wherein
    the first external connection portion extends in a third direction parallel or substantially parallel to the third signal line or the fourth signal line, and a fourth direction perpendicular or substantially perpendicular to the third direction; and
    the third electrode pad and the fourth electrode pad are at different positions in the third direction and the fourth direction.

20. The electronic device according to claim 19, wherein, at a position in which the third electrode pad and the fourth electrode pad are closest to each other, the third electrode pad and the fourth electrode pad are at different positions in the third direction and the fourth direction.

* * * * *